(12) United States Patent
Sasaki et al.

(10) Patent No.: US 6,352,775 B1
(45) Date of Patent: Mar. 5, 2002

(54) CONDUCTIVE, MULTILAYER-STRUCTURED RESIN PARTICLES AND ANISOTROPIC CONDUCTIVE ADHESIVES USING THE SAME

(75) Inventors: Ichiro Sasaki, Osaka; Tatsuo Fujii, Shimizu; Shinji Tachibana, Osaka, all of (JP)

(73) Assignee: Takeda Chemical Industries, Ltd., Osaka (JP)

( * ) Notice: Subject to any disclaimer, the term of this patent is extended or adjusted under 35 U.S.C. 154(b) by 0 days.

(21) Appl. No.: 09/629,879

(22) Filed: Aug. 1, 2000

(51) Int. Cl.⁷ .............................. B32B 7/02; B32B 27/14
(52) U.S. Cl. ....................... 428/403; 428/407; 523/201; 407/222
(58) Field of Search ................................ 428/403, 407; 523/201; 407/222

(56) References Cited

U.S. PATENT DOCUMENTS 5,162,087 A * 11/1992 Fukuzawa et al.

FOREIGN PATENT DOCUMENTS

| EP | 0 945 495 | 9/1999 |
| JP | 8-188760 | 7/1996 |
| JP | 8-193186 | 7/1996 |
| JP | 11-209714 | 8/1999 |

* cited by examiner

Primary Examiner—Tae H. Yoon
(74) Attorney, Agent, or Firm—Wenderoth, Lind & Ponack, L.L.P.

(57) ABSTRACT

The anisotropic conductive adhesives containing the conductive, multilayer-structured resin particles in which at least one inner layer is more flexible than the outermost layer and is chemically bound to at least one of the two adjacent layers and the surface of the outermost layer is covered with a metal make connections at lowered pressure enough to suppress development of cracking of the ITO electrode and also can provide enhanced stability, especially stability of connection over a prolonged period of time.

11 Claims, 3 Drawing Sheets

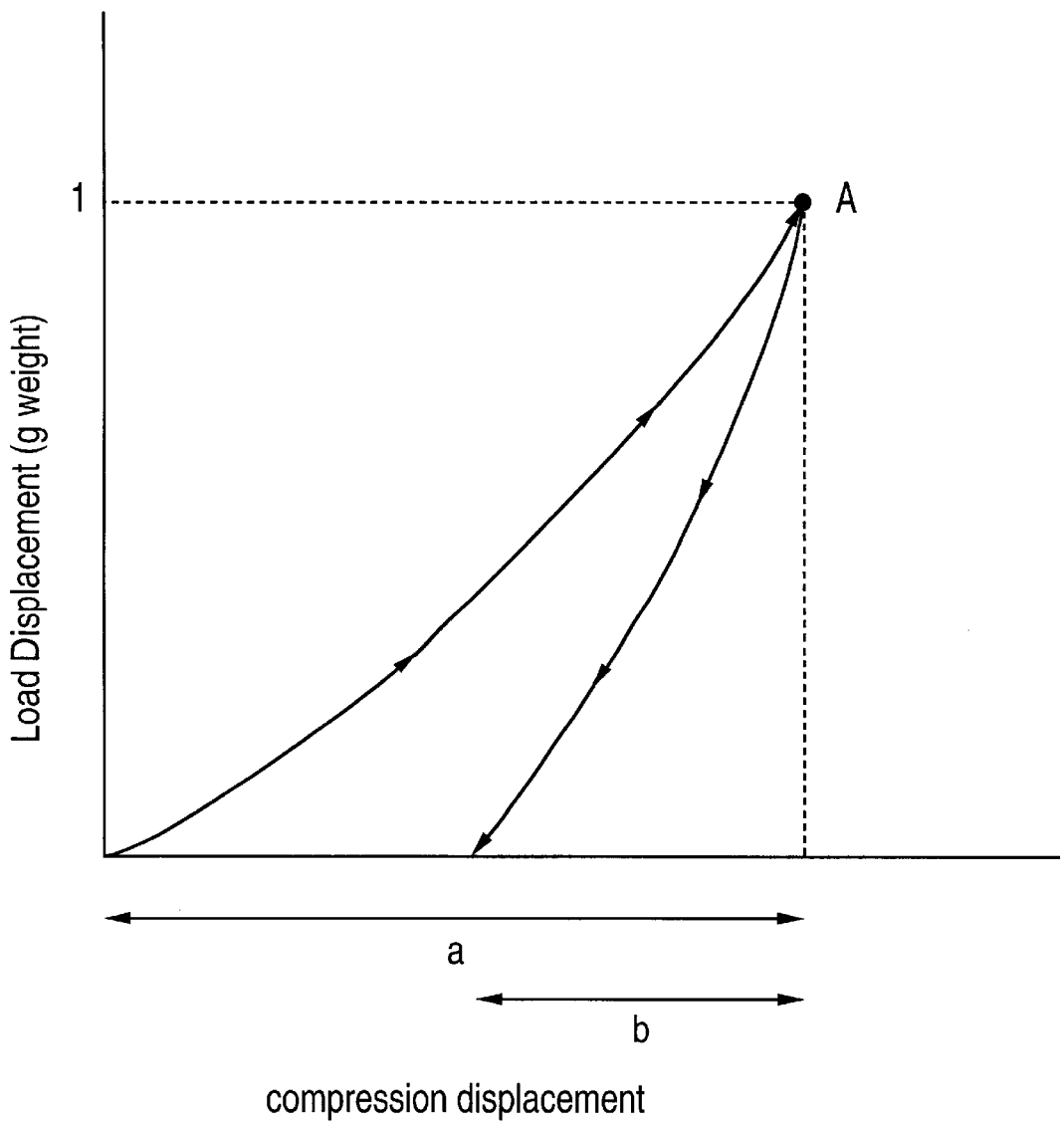

CONDUCTIVE, MULTILAYER-STRUCTURED RESIN PARTICLES AND ANISOTROPIC CONDUCTIVE ADHESIVES USING THE SAME

BACKGROUND OF THE INVENTION

1. Field of the Invention

The present invention relates to conductive resin particles possessing a multilayer structure, and to anisotropic conductive adhesives based on the same which are useful in (1) the connection of LCD (Liquid Crystal Display) with its driving circuits, e.g. TCP (Tape CarrierPackage), FPC (Flexible Printed Circuit), (2) connection of semiconductor chips onto an LCD glass substrate named COG (Chip on Glass), (3) connection of semiconductor chips to a circuit substrate, for example in COF (Chip On Flexible printed circuit) and COB (Chip On Board), (4) connection of a semiconductor chip called FCA (Flip Chip Attachment) to a semiconductor substrate, and the like.

2. Description of the Prior Art

Anisotropic conductive adhesives are fundamentally composed of an adhesive resin and conductive particles being dispersed therein. The characteristic feature that such anisotropic conductive adhesives offers in making the connection lies in the anisotropy which permits electric current to be conducted only between the sites intended to be connected by way of conductive particles or in the direction of the Z-axis alone but not in the directions of the X- and Y-axes, while, on the other hand, the characteristic feature in terms of use is in that a extremely huge number of sites can be connected simultaneously.

The anisotropic conductive adhesives, ever since they were for the first time used in the form of ACF (Anisotropic Conductive Films) in the connection of liquid crystal panels for electronic calculators in the 1970's, have been finding widened application in the liquid-crystal related industries as a connecting material with high reliability, and also have recently started to be utilized in other application field of semiconductor fabrication.

The anisotropic conductive adhesives have advanced steadily together with liquid crystals and also achieved higher function performance, while finding extensive application in the simultaneous multi connection between ITO (Indium Tin Oxide) tabs on a glass substrate for liquid crystals and printed contacts on its driving circuit substrate. During the course of this, great progresses have been made in (1) the size reduction of electronic parts as well as (2) the downsizing or the downscaling of connecting sites, coupled with the space narrowing between connecting sites, owing to multiplication of connecting sites brought about by full-colored and enlarged-liquid crystal display screens, whereby (1) correspondence to the space narrowing between connecting sites and (2) improvement of reliability of connection are consistently demanded for the anisotropic adhesives.

In the field of semiconductor packaging, on the other hand, there have been developed the packaging process by means of the flip chip connection in which a silicon chip is arranged in the face-down manner for the purpose of faster action of semiconductors. Referring to the flip chip connection, especially, the ACF-based technique makes it feasible to eliminate entirely the under-fill step to suppress stress concentration on the connecting sites caused by variations in coefficient of linear expansion between silicon chip and semiconductor substrate, and therefore has been attracting attention. Furthermore, the ACFs are a lead-free, environment-friendly material, unlike the C4 connection (Controlled Collapse Chip Connection) which is also one of the same flip chip connection procedures.

Because of the above-described characteristic features, the anisotropic conductive adhesives which once had been used only as an elementary material for connection of liquid crystals have become widely known in the semiconductor packaging field as well by following the currently prevailing trend toward size reduction and higher function performance including CSP (Chip Size Package, Chip Scale Package) and BGA (Ball Grid Array) in the industrial circles of semiconductors.

The anisotropic conductive adhesives are now used in large quantities with increasing amounts of liquid crystals used, and in recent years, their new application fields have been developed, such as resin film fabrication of liquid crystal panels and the above-mentioned application in the semiconductor packaging field. Namely, the anisotropic conductive adhesives have undergo changes in terms of quantity and quality, but the strongly demanded requirements for them have remained unchanged, lying in (1) correspondence to the space narrowing between connecting sites and (2) improvement of reliability of connection. How to cope with such demanded requirements depends largely upon the design of conductive fine particles in light of the connection mechanism of anisotropic conductive adhesives, especially the mechanism of how reliability of connection can be developed. In other words, the future promise of the anisotropic conductive adhesives could be influenced to a great extent by their key material, or the conductive particles.

The reliability of connection requires an understanding of the mechanism of how the anisotropic conductive adhesives conduct current. As illustrated in FIGS. 1 and 2, heating, followed by compression, allows the conductive particles to be located between the connecting sites to thereby achieve electrical connection.

In order to secure electrical connection, on the occasion of this, it is required to keep on compressing the connecting sites against the conductive particles. The continued compressing force arises in the first place from shrinkage through curing of the adhesive, whereby the stress is in a direct proportion to (1) elastic modulus of the adhesive, (2) $\Delta T$ (difference between the curing temperature and the use temperature) and (3) $\Delta \alpha$ (difference in coefficient of linear expansion between the adhesive and the substrate to be joined). When the stress force becomes too great, warping takes place as is being described below, leading to deteriorated long-term reliability of the connection material. Conversely, too much small force fails to produce the acting force sufficiently to deform the conductive particles to a greater extent, resulting in increases in connection resistance, and is therefore not desirable.

Secondly, the continued compressing force is the force of repulsion against deformation of the conductive particles. Consequently, resin particles are preferred to metal particles such as nickel particles. In addition, such deformation broadens the contact area of the connecting site with the conductive particles, which in turn decreases electrical resistance and improves reliability of connection. Such conductive particles which have been investigated so far in the past include, for example, carbon particles such as particles of carbon black and graphite, metal particles such as particles of aluminum, nickel, copper, silver, gold, and resin particles having their surfaces covered with metal.

With reference to the resin particles having their surfaces covered with metal, furthermore, particles of insulating resins, such as polydivinylbenzene, crosslinked polystyrenes, crosslinked acrylic resins, benzoguanamine resins and melamin resins were investigated and have been put into actual use. However, it has been known that in the case of use of resin particles, there are encountered the following problems:

Namely the conductive particles remain in surface contact with the connecting sites while the used adhesive is heated and compressed, and in this case, it is preferable to secure the greater contact surface area, since it yields the smaller contact resistance. In addition, when the conductive particles show an increased restoring rate, they get into contact with the connecting sites under enhanced contact pressure, which in turn facilitates the contact resistance to be maintained at a constant level over a prolonged period of time. Nevertheless, there is incurred a contradiction in the facts that the more flexible conductive particles give rise to the greater contact surface area, whereas the more rigid conductive particles yield the higher restoring rate. In other words, when the conductive particles are made more flexible to decrease the contact resistance, they become more susceptible to plastic deformation and exhibit inferior elasticity and lower restoring rate, with the result that the contact resistance get less stable. Conversely, when the conductive particles are made more rigid, they show greater restoring rate and act to raise the contact pressure but at decreased contact surface area as small as near to the point contact, resulting in increased contact resistance; in either case, there is encountered the problem that the resultant electrical connection lacks in reliability.

Under these circumstances, it may be conceivable to provide the conductive particles having an intermediary degree each of flexibility and restoring rate, but in such a case, it is not possible to retain the advantages that they, with their flexibility, would be susceptible to deformation and that they, because of their rigidity, would develop an increased restoring rate, while making up for their individually derived disadvantages. This, coupled with their intermediary properties being just intermediate between the two states, leaves the problems unsolved in that their initial resistance is far from being low and unsatisfactory and that the resultant long-term reliability of electrical connection after aging is in adequate.

The conductive particles for the anisotropic conductive adhesives which can meet these contradicting properties simultaneously include, for example, multilayer-structured particles each having a rigid, highly restoring layer and a flexible, deformable layer.

Particularly, JP-A Hei 11-209714 discloses an art covering the conductive particles which are characterized in that such conductive particles are made of an acrylic resin consisting of a flexible core and a shell more rigid than the core. In this specification, mention is made only of a shell/core weight ratio as a factor influencing the restoring rate, but it should be pointed out that only if such weight ratio is resorted to, there would in some cases be produced conductive particles with inferior restorability and consequently deteriorated long-term reliability as an anisotropic conductive adhesive, depending upon the particle composition.

Also, JP-A Hei 8-193186 discloses a particle structure reverse to that of JP-A-Hei 11-209714, or an art covering the conductive particles which are characterized in that said conductive particles consist of a flexible outer layer and a inner core being more rigid than the outer layer. In this case, it should be noted that the said conductive particles, because of their flexible outer layers, often exhibit enhanced plasticity and therefore reduced elasticity, leading to inferior restoring rate, as compared with the counterparts having the same degree of modulus of elasticity or flexibility as those disclosed in JP-A-Hei 11-209714.

In an example of production multilayer particles, additionally, the description is given that multilayer and composite particles are produced with use of hybridization by allowing two kinds of particles to collide at high speeds. This signifies that the two layers exist independently, with absence of any chemical bond between them, often providing the multilayer particles with deteriorated restoring rate.

As a measure in connecting of FPC to a liquid crystal panel, JP-A-Hei 8-188760 discloses the conductive particles which are characterized by less than 10 kgf /mm2 in compressive strength at 10% compressive deformation. However, decreased compressive strength alone does not yield any anisotropic conductive adhesives with realizable long-term reliability, as mentioned previously in the above.

SUMMARY OF THE INVENTION

In consideration of the above-described problems, the object of present invention is to provide conductive multilayer structured particles having in combination the contradictory properties of flexibility and restoring property or restorability.

Also, another object of the present invention lies in providing the conductive multilayer structured resin particles and the anisotropic conductive adhesives containing such particles, which permit connection to be made under such a low pressure as may suppress development of cracking in the ITO tabs and also can realize increased stability of connection, especially long-term stability of connection.

The present inventors, with a specific aim to solving the above-described problems, conducted repeatedly extensive investigation, and as a result, found that the conductive resin particles obtained by providing a metal covering to each of multilayer-structured resin particles, which particles are characterized in that said particles each comprises at least one inner layer being more flexible than the outermost layer and that at least one of the adjacent two layers is chemically bound, exhibit flexibility and restoring property in combination. In addition, it was found that the anisotropic conductive adhesive produced by dispersing such conductive multilayer-structured resin particles into a resin component of adhesive can permit connection to be made under such a low pressure as may suppress development of cracking in the ITO tabs and also can realize enhanced degree of reliability of connection, especially long-term stability of connection, and such findings have culminated into completion of the present invention.

Namely, the present invention relates to:

(1) A conductive, multilayer-structured resin particle in which at least one inner layer is more flexible than the outermost layer and is chemically bound to at least one of the two adjacent layers, and the surface of the outermost layer is covered with a metal;

(2) A conductive, multilayer-structured resin particle as described above in (1), characterized in that the difference in glass transition temperature between the most flexible layer and the most rigid layer is not less than 20° C.;

(3) A conductive, multilayer-structured resin particle as described above in (1) or (2), characterized in that at least one of the chemically bound, two adjacent layers contains a graft-polymerizable monomer;

(4) A conductive, multilayer-structured resin particle as described above in (1) to (3), characterized in that said conductive, multilayer-structured resin particle possesses a three-layer structure consisting of a rigid, central core layer, an intermediate layer which is more flexible than the central core and the outermost layer which is more rigid than the intermediate layer, with any adjacent two of these three layers being chemically bound;

(5) A conductive, multilayer-structured resin particles as described above in (1) to (4), characterized in that said conductive, multilayer-structured resin particle under stress of 10% deformation rate exhibits a compressive strength of less than 10 kgf/mm$^2$;

(6) A conductive, multilayer-structured resin particle as described above in (1) to (5), characterized in that said conductive, multilayer-structured resin particle furthermore shows a restoring rate of 5 to 90%;

(7) An anisotropic conductive adhesive which comprises an adhesive resin component and a conductive, multilayer-structured resin particle as described above in (1) to (6);

(8) An anisotropic conductive adhesive as described above in (7), characterized in that an adhesive resin component contains particles showing rubber elasticity;

(9) An anisotropic conductive adhesive as described above in (7), characterized in that a particle showing rubber elasticity is a multilayer-structured particle consisting of not less than two layers.

(10) A stress relaxing agent, characterized in that said stress relaxing agent comprises a particle showing rubber elasticity as described above in (9).

BRIEF DESCRIPTION OF THE DRAWINGS

FIG. 3 shows a graph to be used in calculating the restoring rate.

DESCRIPTION OF THE NUMERICAL SIGNS

Figure 1:
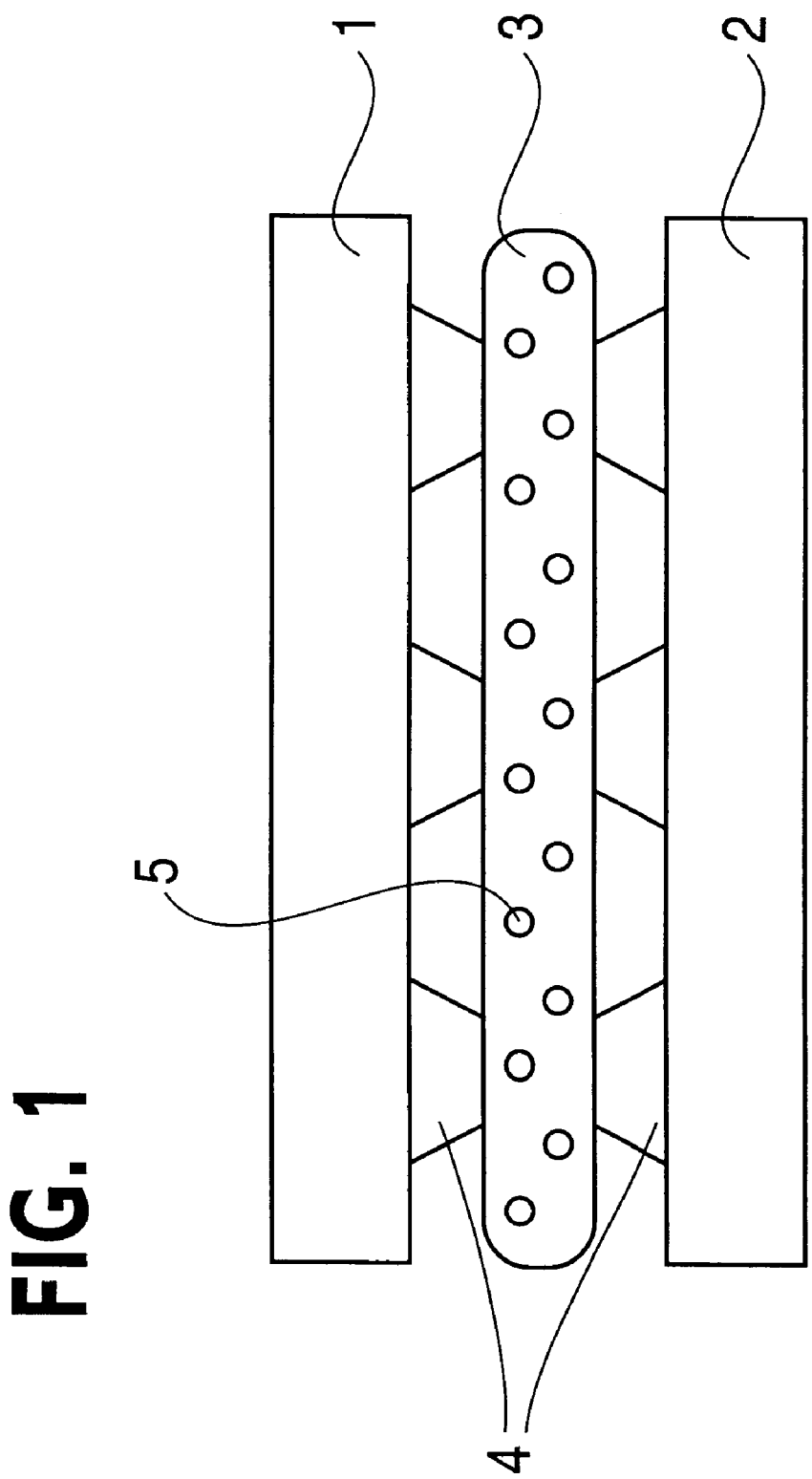
FIG. 1 shows the microscopic structure of the anisotropic conductive adhesives according to the present invention.
Figure 2:
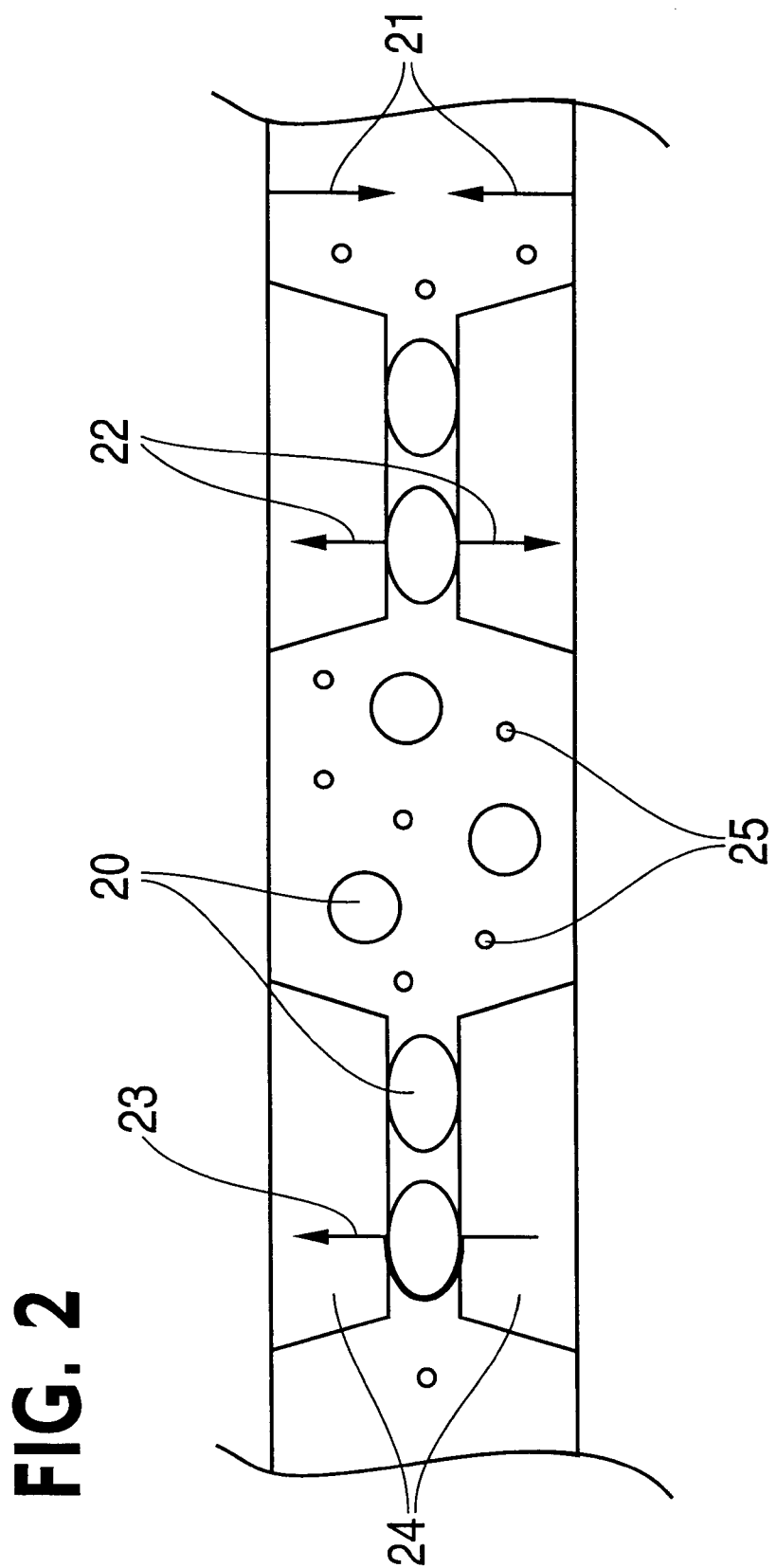
FIG. 2 illustrates the microscopic structure of the adhered portion after adhesion with the anisotropic conductive adhesives according to the present invention.

1: Semiconductor chips, such as TCP and FPC.
2: Glass or resin substrate
3: Anisotropic conductive adhesive
4: Connecting site (or ITO electrode when the numeral 2 is glass).
5: Conductive, multilayer-structured resin particles
20: Conductive, multilayer-structured resin particles
21: Shrinking stress of adhesive
22: Repulsion force of the conductive, multilayer-structured resin particles
23: Direction of current conduction
24: Connecting site
25: Particles having rubber elasticity

DETAILED DESCRIPTION OF THE INVENTION

The flexibility of a resin is closely related with its glass transition temperature, and generally, the lower the glass transition temperature, the higher the flexibility.

In order to produce the multilayer structured resin particles having at least one of the inner layers being more flexible than the outermost layer according to the present invention, consequently, the difference in glass transition temperature between the most flexible layer and the most rigid layer preferably is not less than 20° C.

So as to impart an adequate degree of flexibility to the resin layer, furthermore, the glass transition temperature of the most flexible layer normally is in the range of about −40 to 80° C., preferably in the region of about −20 to 80° C. and more preferably in the range of about 0 to 75° C. On the other hand, the glass transition temperature of the most rigid layer is preferably in the region of about 100 to 140° C., more preferably in the range of about 105 to 130° C., for the purpose of impart increased restoring rate to the multilayer-structured resin particles to thereby give an anisotropic conductive adhesive with an enhanced degree of reliability of connection.

Employed throughout the specification as the glass transition temperature are the figures, which are determined, as broken down into respective polymer layers of the multilayer-structured polymer and on the basis of Tgn for the homopolymers from each of different monomers which constitute each polymer, through calculation from the equation (1):

$$1/Tg = \Sigma Wn/Tgn \quad (1)$$

(wherein Tgn is Tg of each constituent homopolymer, as expressed in absolute scale of temperature, and Wn is a weight fraction of each constituent homopolymer).

As a Tgn value for each constituent homopolymer as used in the above equation (1), for example, there may be mentioned 233K (−40° C.) for butyl acrylate homopolymer and 403K (130° C.) for methyl methacrylate homopolymer.

The multilayer-structured resin particles as used in the present invention can be produced by the procedures known per se or those corresponding thereto. Preferably, they can be obtained by the continuous multi-step suspension polymerization method involving a sequential repetition of the polymerization process in which, in the presence of a polymer serving the inner resin layer as produced by a polymerization reaction, a monomer forming an adjacent outer resin layer is polymerized.

More specifically, such multilayer-structured resin particles can be produced by the below-described procedure: firstly, the core-part resin layer is formed by the polymerization reaction, whereby the core part normally is spherical-shaped and is to be referred to as a layer; preferably when the conversion ratio in the polymerization for forming a core-part resin layer reaches not less than about 90%, then, there is added a polymerizable monomer to form the second resin layer to allow the polymerization to proceed; and this procedure can be repeated sequentially to thereby give a suspension of the multilayer-structured resin particles.

Since the multilayer-structured resin particles according to the present invention have at least one of the inner layers being more flexible than the outermost layer, polymerizable monomers to be added may be selected as being described below to provide the desired structure:

In the case of production, any per se known polymerization processes may be adopted, with the radical polymerization being preferred. Among others, the suspension polymerization is desirable from the standpoint of cost efficiency.

Furthermore, the multilayer-structured resin particles as produced by the suspension polymerization possess the following advantages other than cost efficiency over those obtained by the dispersion polymerization:

In the first place, the suspension polymerization can allow dispersion agents or stabilizers and surfactants adhered onto the resultant multilayer-structured resin particles to be removed easily and almost completely, thus preventing any damages to their electric characteristics caused by such contaminants. Secondly, it is easy to incorporate a variety of copolymers, oligomers and organic solvents into the outermost layer in order to effect the surface rough finishing, one of the catalyst activating treatments in the electroless plating.

The multilayer-structured resin particles according to the present invention are characterized in that at least one of the adjacent two interlayers is chemically bound in order to further strengthen their restoring force. Among others, it is preferred to have their individual layers being chemically bound.

The state of "chemically bound" as used herein is understood to denote "The chemical bond is formed between the adjacent interlayers. More concretely, the chemical bond is formed through or across the border between the two adjacent interlayers, and one interlayer is firmly or strongly adhered to its adjacent interlayer by the chemical bond formed between inside of one interlayer and inside of its adjacent interlayer.", and the resin constituting an inner layer and the one constituting an outer layer, at least in part, are preferably bound or linked for example through the carbon-carbon, ester, ether, amide or disulfide bond, etc.

In other words, chemical binding of the adjacent two layers is normally effected by allowing a polymer or monomer in one layer to react with a polymeric compound or monomer in its adjacent layer through a boundary face between said two layers to thereby form a chemical bond crosslinking the two layers, such as the carbon-carbon, ester, ether, amide or disulfide bond.

In order to bind chemically the adjacent two interlayers, any known techniques can be employed. For example, the preferred embodiment is to be exemplified for the formation of the carbon-carbon bond. Preferred is the method in which a graft-polymerizable monomer is added on the occasion of formation of an inner resin layer.

The graft-polymerizable monomer normally possesses not less than two unsaturated double bonds within the molecule, wherein such two or more unsaturated bonds preferably exhibit individually different rates of reaction with other copolymerizable monomers. On the occasion of polymerization to form an inner layer, this permits unsaturated double bonds in the graft-copolymerizable monomer which shows a faster rate of reaction to react with other copolymerizable monomers (including different graft-polymerizable monomers) but allows the remaining unsaturated doubles bond not to bind to such copolymerizable monomers, thereby leaving their reactivities intact. At this point of time, when monomers to form an outer layer are added to the reaction mixture, said intact unsaturated double bonds undergo binding to the copolymerizable monomers to form an outer layer, whereupon there can be formed the bond between the resin constituting the inner layer and the one constituting the outer layer.

In the present invention, as the graft-polymerizable monomer, per se known compounds can be used, and may be exemplified by allyl esters of unsaturated carboxylic acids, such as allyl acrylate, allyl methacrylate, dially maleate, dially fumarate and dially itaconate, with allyl methacrylate being particularly preferred. These monomers may be utilized solely or in mixture of not less than two.

Other copolymerizable monomers include, for example, alkyl acrylates or alkyl methacrylates, aromatic vinyl monomers, crosslinking monomers and other copolymerizable monomers. As such monomers, use can be made of those mentioned in the below-given description of two-layer structured resin particles:

Referring now to the production of the multilayer-structured resin particles, below described in detail is the procedure for forming a two-layer structured resin particle having a core part composed of a polymer layer of less than 80° C. in glass transition temperature (Tg) and an outer layer composed of a polymer layer of not less than 100° C. in glass transition temperature (Tg); nevertheless, such two-layer structured resin particle constitutes an embodiment of the present invention, and needless to say, the present invention is not understood to be limited to the same.

The first layer forming reaction in the present invention involves a reaction to form a resin layer of less than 80° C. in glass transition temperature (Tg) by radical polymerization or suspension polymerization from a polymerizable monomer capable of forming a resin layer of less than 80° C. in glass transition temperature (Tg) through polymerization. A preferred example of such polymerizable monomer is a monomer mixture consisting of (a) an alkyl acrylate or alkyl methacrylate (hereinafter expressed as "alkyl (meth) acrylate") in the range of about 45 to 99.8 wt. % , (b) a crosslinking monomer in the range of about 0.1 to 50 wt. % , (c) a graft polymerizable monomer serving to bind chemically two adjacent interlayers in the region of about 0.1 to 5 wt. % and (d) other copolymerizable monomer in the range of about 0 to 54.8 wt. %.

As the above-described alkyl (meth)acrylate, there can be mentioned alkyl (meth)acrylates having 2 to 20 of a number of carbon atoms, such as ethyl (meth)acrylates, propyl (meth)acrylates, butyl (meth)acrylates, cyclohexyl (meth) acrylates, 2-ethylhexyl (meth)acrylates, isononyl (meth) acrylates, lauroyl (meth)acrylates and stearyl (meth) acrylates. Preferred among them are alkyl (meth)acrylates with the alkyl moiety of 2 to 10 carbon atoms, such as butyl (meth)acrylates, 2-ethylhexyl (meth)acrylates and isononyl (meth)acrylates, with ethyl acrylate, butyl acrylate and 2-ethylhexylacrylate being particularly preferable. Such alkyl (meth)acrylates are used normally in proportions ranging from about 45 to 99.8 wt. %, preferably about 51 to 99 wt. % of the polymerizable monomers capable of forming a polymer layer of less than 80° C. in glass transition temperature (Tg) through polymerization. The expression "(meth) acrylate" is intended to denote acrylate or methacrylate, and the same applies to the description hereinafter given.

In this first layer reaction, it is desirable to use crosslinking monomers having not less than two unsaturated double bonds within the molecule in order to control rubber elasticity or modulus of elasticity of the resin layer of less than 80° C. in glass transition temperature (Tg) or to improve its heat resistance, solvent resistance, etc. As such crosslinking monomer, there can be mentioned aromatic vinyl monomers, such as divinylbenzene; alkanepolyol polyacrylates or alkanepolyol polymethacrylates, such as ethylene glycol di(meth)acrylate, butylene glycol di(meth)acrylate, hexanediol di(meth)acrylate, oligo-ethylene glycol di(meth) acrylate, trimethylolpropane di(meth)acrylate and trimethylolpropane tri(meth)acrylate; and urethane di(meth)acrylate, polybutadiene di(meth)acrylate, epoxy di(meth)acrylate, and the like. Particularly preferable are ethylene glycol di(meth)acrylate, butylene glycol di(meth)acrylate, hexanediol di(meth)acrylate, urethane di(meth)acrylate, or polybutadiene di(meth)acrylate. Such crosslinking monomers are used normally in proportions ranging from about 0.1 to 50 wt. %, preferably about 0.1 to 45 wt. % of the polymerizable monomers capable of forming a polymer layer of less than 80° C. in glass transition temperature (Tg) through polymerization.

The graft-polymerizable monomer having not less than two different unsaturated double bonds within the molecule acts to interrelate among individual layers in the multilayer-structured resin particle. A flexible layer showing lowered modulus of elasticity alone undergoes plastic deformation, but can be chemically bound to the adjacent layer to thereby suppress plastic deformation, resulting in elicitation of the function to increase the restoring rate.

As such graft-polymerizable monomer, there can be mentioned allyl esters of unsaturated carboxylic acids, such as allyl acrylate, allyl methacrylate, dially maleate, diallyl fumarate and diallyl itaconate, with allyl methacrylate being particularly preferred.

Such graft-polymerizable monomers are used normally in proportions ranging from about 0.1 to 5 wt. %, preferably about 0.5 to 4 wt. % of the polymerizable monomers capable of forming a polymer layer of less than 80° C. in glass transition temperature (Tg) through polymerization.

As the copolymerizable monomer which can copolymerize with alkyl (meth)acrylates, crosslinking monomers and graft-polymerizable monomers in the first layer reaction, furthermore, there can be mentioned aromatic vinyl monomers or aromatic vinylidenes, such as styrene, vinyltoluene and α-methylstyrene; vinyl cyanides or vinylidene cyanides, such as acrylonitrile and methacrylonitrile; alkyl (meth) acrylates, such as methyl methacrylate, methyl acrylate, urethane acrylates and urethane methacrylates; and aromatic (meth)acrylates, such as benzyl (meth)acrylate and phenylethyl acrylate. Suitable used among them are styrene, acrylonitrile and methyl methacrylate.

In addition, monomers having such functional groups as epoxy, carboxyl, hydroxyl or amino group can be subjected to copolymerization. For example, glycidylmethacrylate, etc. can be mentioned as a monomer having an epoxy group, and a monomer having a carboxyl group includes, for example, methacrylic acid, acrylic acid, maleic acid and itaconic acid. As a monomer having a hydroxyl group, there may be mentioned 2-hydroxyethyl (meth)acrylate, 2-hydroxypropyl (meth)acrylate, 2-hydroxybutyl (meth) acrylate and the like, while as a monomer having an amino group, there are mentioned diethylaminoethyl methacrylate, diethylaminoethyl acrylate, etc.

Such copolymerizable monomers are used normally in proportions ranging from about 0 to 54.8 wt. %, preferably about 0 to 39.5 wt. % of the polymerizable monomers capable of forming a resin layer of less than 80° C. in glass transition temperature (Tg) through polymerization.

The said first layer reaction is carried out by charging the above-mentioned polymerizable monomers capable of forming a resin layer of less than 80° C. in glass transition temperature (Tg) through polymerization, dispersion stabilizer, oil-soluble radical polymerization initiator and water or an organic solvent acting as a dispersion medium into a polymerization vessel, followed by radical polymerization under stirring, or suspension polymerization or dispersion polymerization, whereby suspension polymerization is preferred as previously described.

The steps of suspension polymerization are exemplified in the following:

The oil-soluble radical polymerization initiator may be exemplified by organic peroxides, such as benzoyl peroxide, o-methoxybenzoyl peroxide, o-chlorobenzoyl peroxide. lauroylbenzoyl peroxide, cumeme hydroperoxide and diisopropylbenzene hydroperoxide, and azo compounds, such as 2,2'-azobisisobutylonitrile and 2,2'-azobis-2,4-dimethylvaleronitrile. Preferably usable among them are benzoyl peroxide, lauroyl peroxide and 2,2'-azobis-isobutyronitrile. Such radical polymerization initiators can be used solely or in not less than two.

The used amount of the radical polymerization initiators is for example in proportions ranging from about 0.1 to 5 parts by wt., preferably about 0.1 to 3 parts by wt., against 100 parts by wt. of the polymerizable monomers in the first layer reaction.

The above-described dispersion stabilizer can be exemplified by water-soluble high molecular compounds, such as gelatin, methyl cellulose, hydroxyethyl cellulose, hydroxypropyl cellulose, carboxymethyl cellulose, polyethylene glycol, polyoxyethylene-polyoxypropylene block copolymers, polyacrylamides, polyacrylic acids, polyacrylates, sodium arginate and partially saponified polyvinyl alcohols, and organic materials, such as tricalcium phosphate, titanium oxide, calcium carbonate and silicon dioxide.

Particularly among such dispersion stabilizers, partially saponified polyvinyl alcohols, hydroxypropyl cellulose and tricalcium phosphate are preferably used.

Such dispersion stabilizers can be used solely or in not less than two.

The used amount of such dispersion stabilizers is, for example, in proportions ranging from about 0.1 to 30 parts by wt., preferably about 0.5 to 10 parts by wt., against 100 parts by wt. of the polymerizable monomers in the first layer reaction.

In order to stabilize the dispersion of liquid particulates of monomers, if desired, there may be added surfactants, such as anion surfactants being exemplified by sodium dodecylbenzenesulfonate, sodium dialkyl sulfosuccinate, sodium laurylsulfonate and sodium dioctylsulfosuccinate, nonionic polyethylene glycol nonylphenyl ether and polyoxyethylene monostearate.

Such surfactants can be used solely or in not less than two.

The used amount of such surfactants is, for example, in proportions ranging from about 0.05 to 2 parts by wt. against 100 parts by wt. of the polymerizable monomers in the first layer reaction. And, if desired, there maybe added inhibitors for aqueous-phase polymerization, such as sodium nitrite.

In the step of polymerizing the above-described monomers to form resin particles of less than 80° C. in glass transition temperature (Tg), it is desirable to control and adjust, in advance of initiation of reaction, the liquid particulates of monomers to the desired size by stirring under shearing force a mixture of polymerizable monomers, dispersion stabilizers, oil-soluble radical polymerization initiators and deionized water.

For the purpose of forming micro-sized liquid particulates of monomers in less than 20 μm of diameter in this case, it is preferable to employ different types of dispersion means, such as homomixer, homodisper, homogenizer, CLEAR MIX® and line mixer, whereby CLEAR MIX® is more preferable in order to attain a sharper particle-size distribution.

The size of liquid particulates of monomers and its distribution can be controlled by means of the type of dispersion equipment employed and adjustment of its shearing force, e.g. revolution speed.

The liquid particulates of monomers as prepared by the above procedure are normally warmed to above a temperature in the neighborhood of the 10-hours half-life temperature of the used radical polymerization initiator, and polymerization is carried out to thereby give a suspension of polymer particles of less than 80° C. in glass transition temperature (Tg) in the first layer reaction.

For example, such liquid particulates of monomers are warmed to not less than 55° C. in the case of lauroyl peroxide used, or to not less than 65° C. in the case of 2,2'-azobisisobutyronitirle used, followed by radical polymerization to give a suspension of resin particles of less than 80° C. in glass transition temperature (Tg) in the first layer reaction.

In the second layer reaction, then, polymerizable monomers capable of forming a resin layer of no less than 100° C. in glass transition temperature (Tg) through polymerization are added in the presence of the suspension of resin particles of less than 80° C. in glass transition temperature (Tg) obtained in the above-mentioned first layer reaction, and radical polymerization is conducted to form a resin layer of not less than 100° C. in glass transition temperature (Tg), whereupon there is provided a suspension of multilayer-structured resin particles.

Preferred as a polymerizable monomer capable of forming a polymer layer of not less than 100° C. in glass transition temperature (Tg) through polymerization is a mixture of at least one selected from a group consisting of (e) alkyl (meth)acrylates and (f) aromatic vinyl monomers, and, if desired, (g) a crosslinking monomer having not less than two unsaturated bonds within the molecule and (h) other copolymerizable monomers.

As the alkyl (meth) acrylates, there may be mentioned alkyl (meth)acrylates having 1 to 4 of a number of carbon atoms, such as methyl acrylate, methyl methacrylate, ethyl acrylate and ethyl methacrylate.

The aromatic vinyl monomers include, for example, styrene, vinyltoluene and α-methylstyrene.

The total used amount of these monomers is normally in proportions ranging from about 50 to 100 wt. %, preferably about 60 to 100 wt. %, based on the polymerizable monomers used in the second layer reaction.

It is preferable to use crosslinking monomers having not less than two unsaturated bonds within the molecule in the second layer reaction. Such crosslinking monomers can also control plastic deformation caused on the occasion of heating the conductive, multilayer-structured resin particles.

As such crosslinking monomers having not less than two unsaturated bonds within the molecule, there can be used the same as described previously, and they can used normally in proportions ranging from about 0 to 20 wt. %, preferably about 0 to 10 wt. %, based on the polymerizable monomers in the second layer reaction.

Usable in the second layer reaction in combination with alkyl(meth)acrylates, aromatic vinyl monomers and crosslinking monomers are other copolymerizable monomers being copolymerizable with them, which include, for example, vinyl cyanides and vinylidene cyanides, such as acrylonitrile; alkyl methacrylates, such as methyl methacrylate; alkyl acrylates, such as ethyl acrylate and butyl acrylate; urethane acrylates; epoxy (meth)acrylates; polybutadiene di(meth)acrylates; and allyl esters of unsaturated carboxylic acids, such as allyl acrylate, allyl methacrylate, diallyl maleate, diallyl fumarate and diallyl itaconate.

Furthermore, monomers having functional groups, such as epoxy, carboxyl, hydroxyl, amino, or amide group can be subjected to copolymerization. This, on the occasion of surface metal-covering through electroless plating, also enables Pd ions acting as a catalyst to be supported. For example, monomers having an epoxy group:include glycidyl methacrylate, etc., while monomers having a carboxyl group include methacrylic acid, acrylic acid, maleic acid, itaconic acid and the like. As monomers having a hydroxyl group, there may be mentioned 2-hydroxyethyl methacrylate, 2-hydroxyethyl acrylate, etc., and monomers having an amino group include diethylaminoethyl methacrylate, diethylaminoethyl acrylate, etc., while as monomers having an amide group, there may be mentioned (meth)acrylamides and the like.

The used amount of the above-mentioned copolymerizable monomers is normally in proportions ranging from about 0 to 50 wt. %, preferably from about 0 to 40 wt. %, based on the polymerizable monomers used in the second layer reaction.

The polymerizable monomers used in the above second layer reaction are preferably added at the point of time when the polymerization conversion rate in the first layer reaction exceeds 90% so as to minimize the possibility of bringing about aggregation and melt-adhesion among resin particles on the occasion of dehydration or drying of resin particles.

Referring to the method of adding polymerizable monomers in the second layer reaction, desirably employed is the procedure which involves preparing in advance an emulsion or suspension together with the above-mentioned surfactants or dispersion stabilizers, followed by feeding in once or in divided portions over the desired length of time.

In the second layer reaction, furthermore, polymerization initiators can be added, but in the case of the use of oil-soluble radical polymerization initiators, they can be added separately in the state of a aqueous solution.

As polymerization initiators usable in the second layer reaction, there can be used the oil-soluble radical polymerization initiators as described previously.

With reference to water-soluble radical polymerization initiators, there can be used persulfate based polymerization initiators, such as sodium persulfate and potassium persulfate, and azo compound based polymerization initiators, such as 2,2'-azobis(2-amidinopropane) dihydrochloride, 2,2'-azobis[2-methyl-N-(2-hydroxyethyl)-propionamide], 2,2'-azobis(2-(2-imidazolin-2-yl)propane) and dimethyl methylpropaneisobutyrate.

These radical polymerization initiators can be used solely or in not less than two.

The used amount of the radical polymerization initiators is for example in proportions ranging from about 0.05 to 10 parts by wt., preferably from about 0.1 to 3 parts by wt., against 100 parts by wt. of the polymerizable monomers used in the second layer reaction so that new particles or irregular-shaped particles may be able to be suppressed from be generated and the multilayer structure may be able to be advantageously formed.

The weight ratio of a resin layer of less than 80° C. in glass transition temperature (Tg) as the core part to a resin layer of not less than 100° C. in glass transition temperature (Tg) as the outer layer is normally in the range of about 95/5 to 30/70, preferably about 90/10 to 40/60, more preferably about 85/15 to 50/50.

Alteration in the weight ratio corresponds to adjustment of flexibility, wherein an increased ratio occupied by the core part provides the resultant multilayer-structured resin particles with an enhanced degree of flexibility, and an increased ratio of the outer layer leads to a rise in restoring rate of the multilayer-structured resin particles. This ratio as well as the degree of flexibility which approximately corresponds to the lowered magnitude of the glass transition temperature (Tg) of each of the layers, especially, the core part determine the 10% compressive strength the conductive, multilayer-structured resin particles as being described in the below. The 10% compressive strength bears an extremely close relationship with the contact resistance and contact stability of the conductive, multilayer-structured resin particles.

Also, the ratio of the core part to the outer layer is connected with aggregation or melt-adhesion among polymer particles on the occasion of dehydration and drying such polymer particles, and moreover, too great a ratio occupied by the core part results in deterioration of processability owing to blocking, etc. and also encounters difficulties in the disposability on the occasion of metal plating.

The multilayer-structured resin particles produced by the above procedure show a weight average particle size normally ranging from about 2 $\mu$m to 100 $\mu$m, preferably 2.5 to 20 $\mu$m, and more preferably about 3 to 15 $\mu$m.

The weight average particle size preferably shows the above specified range, from the standpoints of the sharper adjustment of the particle size distribution and the prevention of increases in used amount of the dispersion stabilizer.

In order to make the particle size distribution sharp, meanwhile, it is possible to contain in the polymerizable monomers for the core part different metal complexes and quaternary ammonium salts as a charge controlling agent and furthermore a polymerizable-monomer soluble polymer, such as modified acrylic resins and acryl-styrene based oligomers.

The particle size distribution, or uniformity of particle size, is preferably rendered as sharp as possible, which however makes costs increase, and is desirably less than 1.3 as a dw/dn value.

The expression "dw/dn" as defined in the present invention is understood denote a value obtained by dividing with a number mean particle size "dn" a weight average particle size "dw" as measured by use of Coulter Counter (manufactured by Beckmann-Coulter Co.), a device for measuring a particle size on the basis of the electric resistance method.

Also the resin forming the outermost layer can be incorporated with multilayer-structured particles having a rubbers component with a primary particle size as small as below about 1 $\mu$m, or a butadiene acrylate.

This enables the particle surfaces to be roughed to a size of belowabout 1 $\mu$m by etching the surfaces with permanganate, and as a result, imparting for supporting of the catalyst Pd in the electroless plating becomes adequate and uniform, which offers the advantage that high-quality plating can be effected.

The procedure for isolating the multilayer-structured resin particles given after conclusion of the reaction includes, for example, a procedure involving dehydration by use of a centrifuge or decompression filter press, followed by drying with a decompression dryer, and a procedure of spray drying.

In advance of isolation, it is desired to carry out appropriate washing as the case may be in order to remove the dispersion stabilizers and surfactants adhered to the multilayer-structured resin particles as well as emulsion-polymerized particles generated as a by-product.

Drying of the multilayer-structured resin particles is preferably effected at low temperatures of below about 70° C. at atmospheric pressure or under reduced pressure, whereby drying is carried out at low temperatures for the purpose of the prevention of melt-adhesion partly among the particles.

The resultant multilayer-structured resin particles are subjected to crushing with a crusher to break possibly produced aggregates, and can be made a finished product for example by screening through a filter of about 100 to 400 mesh.

Such multilayer-structured resin particles, if desired, may furthermore be admixed with inorganic fine particles, such as microparticle silica, lubricants, antioxidants, heat stabilizers, UV absorbents, silane coupling agents and other polymer fine particles.

The conductive, multilayer-structured resin particles of the present invention can be obtained by providing metal covering to the above-mentioned multilayer-structured resin particles.

The metal-covering procedure includes, for example, (1) hybridization with metal particles and (2) electroless plating, and the latter is desirable in giving thin covering enough to impart an adequate degree of flexibility against deformation and also to secure adequate adherence with particles.

Applicable plating metal includes, for example, Fe, Co, Ni, Cu, Pd, Ag or Au, and Ni is the most typical and representative material from an economical point of view. Zn and Mn cannot be imparted solely but may be applicable in alloys thereof.

The electroless plating powder of the present invention may constitute monolayer plating of the same type of metal or multilayer plating from not less than two type of different metals. In the present invention, it is preferable to effect electroless nickel plating as the first layer and subsequently electroless gold plating as the second layer in order to produce increased conductivity and reliability.

The fine plating metal particles maybe either crystalline or amorphous, depending upon their kind and the plating method. For the reason of the same, additionally, such plating metal particles can exhibit either magnetic or non-magnetic property.

Electroless plating can be carried out by the per se known procedure or procedures similar thereto.

Specifically, there may be mentioned, for example, a procedure involving thin and uniform imparting for supporting of the catalyst Pd on the surfaces of multilayer-structured resin particles, followed by electroless plating. By following this procedure, metal ions in the course of electroless plating are allowed to deposit around the catalyst core consisting of Pd and the deposited metal grows to thereby attain uniform plating.

The procedure of activation treatment to impart for supporting the catalyst Pd thinly and uniformly on the surfaces of multilayer-structured resin particles can be carried out by the per se known method or methods similar thereto.

Specifically, the surfaces of multilayer-structured resin particles are made rough, for example, by subjecting either to etching with chromic acid or permanganic acid or to a mechanical roughing, whereby etching can be done, for example, by immersion in a mixture solution of chromic acid and sulfuric acid at a temperature in the range of about 50 to 70° C. for several ten minutes.

Then, the multilayer-structured resin particles are subjected to either of the procedures; (1) a procedure which involves immersion in an aqueous hydrochloride acidic solution of soluble stannous salt (e.g., stannous chloride or stannous fluoride) of a concentration in the range of about 1 to 10 g/L at ambient temperature for several minutes or spraying with the same aqueous solution, followed by immersion in an aqueous hydrochloric acid solution of palladium chloride of a concentration in the range of about 0.1 to 1 g/L at ambient temperature for several minutes or spraying with the same aqueous solution, and (2) a procedure which comprises immersion In aqueous hydrochloride acidic colloidal solutions of palladium chloride of a concentration in the neighborhood of about 0.1 g/L and stannous chloride of a concentration in the range of about 1 to 5 g/L at ambient temperature for several minutes, followed by immersion in hydrochloric acid or sulfuric acid or a 10 to 20% concentrated aqueous solution of sodium hydroxide.

By following such procedures, metallic palladium is generated and is imparted for supporting on the surfaces of multilayer-structured resin particles.

The above-described activation treatment may also be conducted with use of a complex compound produced by reacting a divalent palladium compound with aminosilane.

Namely, the complex compound upon heating yields metallic palladium, which in turn is imparted for supporting on the surfaces of multilayer-structured resin particles.

The divalent palladium compound includes, for example, palladium (II) chloride, palladium (II) fluoride, palladium (II) bromide, palladium (II) iodide, palladium (II) sulfate, palladium (II) nitrate, palladium (II) oxide, and palladium (II) sulfide, and these maybe used solely or in mixture of not less than two.

Preferred among them are halogenides, with palladium (II) chloride being more preferable.

As the aminosilane, preferable are aminosilanes having an amino or imino group capable of forming complexes with the above divalent palladium compounds and having an aminosilyl group capable of reducing the divalent palladium to metallic palladium.

As these aminosilanes, there may be mentioned 3-(2-aminoethylaminopropyl)dimethoxyethylsilane,3-(2-amino ethylaminopropyl)methoxydiethylsilane,3-(2-aminoethylamino propyl)triethylsilane, bis(ethylamino) dimethylsilane. bis(propylamino)dimethylsilane, hexamethyldisilazane, N,N'-bistrimethylsilyl urea, 1,1,3,3,5,5-hexamethylcyclotrisilazane, 1,1,3,3,5,5,7,7-octamethylcyclotetrasilazane, butylaminotrimethylsilane aminomethyltrimethylsilane, 2-waminoethylaminomethyldimethylphenylsilane and 1,3-bis(2-aminoethylaminomethyl)-1,1,3,3-tetramethyldisilo xane, and these may be used solely or in mixture of not less than two.

In order to give a complex compound by reacting a divalent palladium compound with an aminosilane, any known procedures can be employed, and 5 ml of 3-(2-aminoethylaminopropyl)dimethoxymethylsilane can be admixed, for example, with 5 ml of methanol, followed by shaking together with added palladium (II) chloride for 20 minutes to produce the corresponding complex compound.

The resultant compound is found to have the palladium compound coordinated to the amino group of the aminosilane, and upon heating, the divalent palladium is reduced with hydrogen of the methyl group vicinal to silicon.

The heating temperature is preferably in the range of about 50 to 200° C.

In addition, there may be mentioned a procedure which involves subjecting the multilayer structured resin particles to a surface treatment capable of forming a chelate or salt with metal ions, followed by supporting palladium ions.

The method of treating the multilayer-structured resin particles to thereby form a chelate or salt with metal ions includes, for example, a method of treatment with a non-polymeric surface treatment agent.

In the present invention, the non-polymeric surface treatment agent is intended to denote any organic compounds which have at least one of carboxyl, ester, amino, hydroxyl and nitrile groups and halogens as well as such functional groups as alkoxy group capable of biding to silicon or titanium and are capable of forming a chelate or salt with palladium ions.

As the surface treatment agent, specifically, there may be used, for example, aminosilane compounds, such as γ-aminopropyltriethoxysilane and N-β-aminoethyl-γ-aminopropyltrimethoxysilane; amino compounds, such as hexamethylenediamine, trimethylenediamine and diaminododecane; dicarboxylic acids, such as maleic acid, sebasic acid and adipic acid; glycol compounds, such as triethylene glycol, polyethylene glycol and diglycolamine; nitrile compounds, such as malononitrile; titanate compounds, such as isopropyltri(dioctylpyrophosphate)-titanate, titanium di(dioctylpyrophosphate)oxyacetate and isopropyltril-sostearoyl titanate; unsaturated fatty acids, such as linolic acid and linolenic acid.

In order to support palladium ions on the multilayer-structured resin particles with the above-described surface treatment agent, available are the warming-type method which comprises dissolving such surface treatment agent in a suitable solvent, for example, water or an organic solvent such as ethylalcohol, acetone, toluene, dimethylformamide, dimethyl-sulfoxide and dioxane to produce a solution and contacting the solution with the multilayer-structured resin particles through immersion, etc. at ambient temperature or under heating, followed by evaporation, and the dry-type method involving the use of Henschel mixer, etc. to provide mechanical covering with the solution.

The concentration of the surface treatment agent in a solution and the application amount, which may vary depending upon the surface area, physical properties, etc. of the multilayer-structured resin particles as well as a type of surface treatment agents and solvents and the like, is not specifically restricted, but is required in such a quantity enough to permit a unimolecular layer of the surface treatment agent to be formed at least on the multilayer-structured resin particles. In a preferred embodiment, such quantity is in the range of about 0.3 to 100 mg per each $m^2/g$ of unit specific area of the multilayer-structured resin particles.

In conducting the method of supporting palladium ions on the surfaces of multilayer-structured resin particles with the above-described surface treatment agent, there may be mentioned a case in which a mixture solution of the above-described surface treatment agent and palladium ions is prepared in advance, followed by treatment as delineated in the above, and a case where the above-described treatment is conducted in advance, followed by immersion or spray, or mixing for penetration with use of an aqueous solution of palladium salt.

In the case of water used as a solvent, the former method is employed, whereby treatment with a solution of the surface treatment agent supplemented with palladium ions is preferable from a standpoint of the ease of operation.

In any cases, the concentration of a soluble palladium salt is preferably in the range of about 0.05 to 1.0 g/L, more preferably about 0.05 to 0.5 g/L.

In the above-described treatment, the soluble palladium salt includes, for example, the above-mentioned divalent palladium salts.

After supporting palladium ions on the surfaces of multilayer-structured resin particles in the above-described manner, the solvent is removed by heating or air-drying to dry the multilayer-structured resin particles.

In cases where the surface treatment agents upon heating undergo condensation through dehydration, not only the solvent is evaporated, but also further heating is preferably effected at about 110 to 130° C. for about 0.5 to 3 hours to allow curing.

The supported amount of palladium ions on the multilayer structured resin particles may vary according with the type and intended application purpose of a used surface treatment agent, but, in many cases suitably is in the range of about 0.01 to 0.1 wt. %, preferably about 0.01 to 0.05 %, as palladium metal.

In cases where multilayer-structured resin particles can capture palladium ions as a chelate or salt, the above-described surface treatment is not needed.

Such multilayer-structured resin particles include, for example, those having on the surface of their outermost layer one or not less than two of amino, imino, amide, imide, cyano, hydroxyl, nitrile and carboxyl groups.

In supporting palladium ions on such multilayer-structured resin particles, there may be employed the same procedure as the above-described ones.

Normally, electroless plating is to be subsequently conducted, whereby there may be conducted in advance a procedure of reducing the palladium ion captured on the multilayer structured resin particles by means of a reducing agent used in the below-described plating solution.

Referring to the reduction treatment, a reducing agent may be added after capture treatment for palladium ions, but preferably, the activation treatment is completed by firstly effecting separation and washing after capture treatment, and then adding a reducing agent in the form of a solution or itself to an aqueous suspension prepared to move on to the subsequent plating step.

The added amount of a reducing agent varies with the specific surface area of the multilayer structured resin particles and is not constant, but suitably is in the range of about 0.01 to 10 g/L against the suspended material. In this case, to allow a complexing agent to coexist is preferable but is not always essential. As a complexing agent, there may be used complexing agents which are utilized in the below-described plating solution.

The procedure may be conducted at ambient temperature or by warming, with the temperature being not particularly limited.

By conducting the above-described procedure, uniform catalyst cores are formed, which, in cooperation with the action elicited in the subsequent electroless plating step, can contribute to formation of firmly and continuously plated metal films.

After the above-mentioned preliminary step is completed, electroless plating is to be carried out.

In effecting electroless plating, plated metal films when formed on the agglomerated or aggregated multilayer-structured resin particles, are susceptible to peeling-off to expose untreated surfaces, and in order to avoid such phenomenon, consequently, it is desirable to disperse the multilayer-structured resin particles as completely as possible, it is added that for the same reason, adequate dispersion treatment should better be effected in the preceding step.

Dispensability of an aqueous suspension varies, depending upon physical properties of the multilayer-structured resin particles, and the dispersing procedure is desirably carried out with use of a suitably desired means, such as normal-speed or high-speed stirring or a homomixer, or a variety of dispensing means like homodisper to thereby prepare a suspension solution in the dispersion state which is close to the primary particles being freed from agglomerates of the multilayer-structured resin particles as far as possible.

In dispersing the multilayer-structured resin particles, use can be made of such dispersants as surfactants, if desired. Said surfactants which may be used in this invention include, for example, per se known ones employed in the art.

There is no particular, restrictive reason for the concentration of a suspended material, but a lowered slurry concentration, which results in a decreased concentration of a plating solution and increases the treatment volume, is not economical, whereas conversely, a raised slurry concentration causes damage to the dispersability of multilayer-structured resin particles. Therefore, a suitably desired slurry concentration can be established depending upon the physical properties of the multilayer-structured resin particles.

In many cases, the slurry concentration lies in the range of about 1 to 500 g/L, preferably about 5 to 300 g/L.

In plating the multilayer-structured resin particles contained in such suspension, it is desirable to adjust in advance the temperature of the suspension to a plating-achievable temperature, in many cases not less than about 55° C. in order to effect plating efficiently.

Preparation of an aqueous suspension of the multilayer-structured resin particles is desirably carried out, while employing as a dispersion medium an aqueous medium containing at least one chemical agent which constitutes an electroless plating solution, especially an aqueous solution of a complexing agent. Since there is not particularly required a procedure of separation subsequent to the first step of reduction treatment, accordingly, the operation of the second step can be continuously moved on to, outright after conclusion of evolution of hydrogen gas.

In the above description, the expression "at least one chemical agent which constitutes an electroless plating solutions" is understood to denote mainly complexing agents, acid or alkali agents, and surfactants, whereby a deteriorated plating solution can be used.

The said complexing agent normally agent refers to compounds which exert complexing action against plating metal ions, and its examples include carboxylic acids, such as citric acid, hydroxyacetic acid, tartaric acid, malic acid, lactic acid. and gluconic acid, or carboxylilc acid salts, such as their alkali metal and ammonium salts, amino acids, such as glycine, amines, such as ethylenediamine and alkylamines, other ammonium salts, EDTA and pyrophosphoric acid (its salts). These may be used solely or in not less than two.

The content of the complexing agent in a suspension is to be in the range of about 1 to 100 g/L, preferably about 5 to 50 g/L.

Also, the acid or alkali agent or surfactant, which include, for example, the known substances used in the art, may be used in the known proportions.

The aqueous suspension of the multilayer-structured resin particles show a pH value in the region of 4 to 14, but varying pH ranges are established, depending upon the types of plating metals and reducing agents used, as is exemplified in the following Table 1:

TABLE 1

| Covering metal | Reducing agent | Appropriate pH range |
| --- | --- | --- |
| Nickel | Na phosphite | 4 to 10 |
| Nickel | Na or K of borohydride | 7 to 14 |
| Nickel | Hydrazine | 9 to 13 |
| Copper | Formalin | 8 to 12 |
| Silver | Na or K of borohydride | 8 to 14 |
| Gold | Na or K of borohydride | 8 to 14 |

Note: Na and K denote for sodium and potassium, respectively.

The aqueous suspension of the multilayer-structured resin particles as prepared by the above procedure is admixed gradually with a previously prepared plating solution to allow the electroless plating reaction to proceed. On the occasion of this, it is preferred to add to the said suspension an electroless plating solution, after being divided into two portions and individually and simultaneously to conduct the plating reaction.

Constituents of the electroless plating solution include, for example, metal salts, reducing agents, other complexing agents as mentioned in the above, pH adjusting agents or gloss imparting agents usable if desired.

Applicable metal salts include, for example, nickel salts, such as nickel sulfate or nickel chloride, copper salts, such as copper sulfate or copper nitrate, iron salts, such as iron chloride or iron sulfates, silver salts, such as silver nitrate or silver cyanide, gold salts, such as gold cyanide or gold chloride and palladium salts, such as palladium chloride, whereby soluble salts of zinc or manganese, if desired, can be used as a alloy constituent.

These may be used solely or mixed in not less than two.

As the reducing agent, there may be used, for example, sodium hypophosphite, sodium borohydride, potassium borohydride, dimethylaminoborane, hydrazine or formalin.

These may be used solely or mixed in not less than two.

The formulation ratio of a metal salt and reducing agent to be added varies depending upon their combinations and is not constant, but in many cases, their combinations and suitable formulation ratios, on the whole, are preferably interrelated as summarized in Table 2:

TABLE 2

| Metal salt | Reducing agent | Formulation ratio (molar ratio) |
|---|---|---|
| Nickel | Na of phosphite | 1:2 to 3 |
| Nickel | Na or K of borohydride | 1:1.5 to 2.5 |
| Nickel | Hydrazine | 1:3 to 5 |
| Copper | Formalin | 1:3 to 5 |
| Silver | Na or K of borohydride | 1:1.1 to 1.5 |
| Gold | Na or K of borohydride | 1:1.1 to 1.5 |

Note: Na and K denote sodium and potassium, respectively.

The concentration of chemical agents may be at such levels as may reach up to the saturation concentration of each chemical agent, and is not particularly limited, whereas a too lowered concentration is not economical, with the lower limit of the concentration being naturally restricted from the standpoint of practical application.

An addition rate of a solution of chemical agents affects directly the plating reaction and is closely related to the surface area or physical properties of the multilayer-structured resin particles, and it is necessary to add, while taking into consideration such facts, the solution of chemical agents in a strictly controlled manner as may form uniform and tough films without causing any uneven plated films, with gradual, quantitative addition being preferred.

Naturally, it is preferable to effect stirring, ultrasonic dispersion treatment, and the like, if desired, while it is also desirable to provide a suitable setting to enable the temperature to be controlled.

A electroless plating solution, which is added to the aqueous dispersion to undergo dilution to a varying extent in accordance with a magnitude of the volume of the latter, can be used in a more concentrated state than the ordinary plating solutions, in contrast to the ordinary plating operation where the multilayer-structured resin particles, a substrate to be plated, are subjected to immersion treatment in a vessel containing an ordinary concentration of a plating solution.

Addition of a plating solution initiates rapidly the plating reaction, and if each of chemical agents is added in the appropriate proportion, the added metal salts are reduced and deposit on the surfaces of the multilayer-structured resin particles, thus enabling a film thickness of the plating film to be adjusted arbitrarily in accordance with their added amounts.

The metal-covered, multilayer-structured resin particles as produced by the above procedures can furthermore be covered on the surfaces with different kinds of metals in a plural number of layers.

In this case, after conclusion the above-mentioned plating reaction, a plating solution containing a different kind of metal may be added by following the same procedure, or after the reaction solution may be fractionated and a new suspension is prepared, a plating solution containing a different kind of metal may be added.

In the present invention, it is preferred to effect nickel plating as the first layer and gold plating as the second layer, whereby the first nickel plating layer is provided in thickness ranging from about 0.05 to 0.3 $\mu$m and the second gold plating in smaller thickness ranging from about 0.005 to 0.05 $\mu$m.

Upon addition of the plating solution and after no evolution of hydrogen gas is observed, stirring is preferably continued for a while to allow maturation, wherein the plating reaction operation is ended.

Then, separation, washing and drying were effected by the conventional procedures, followed by crushing, if desired, to give the conductive, multilayer-structured resin particles.

The conductive, multilayer-structured resin particles are desirably provided with 10% compressive strength in the range of about 0.5 to 5.0 kg/m$^2$ preferably about 0.5 to 3.5 kg/mm$^2$.

The above range of 10% compressive strength is preferred in order to prevent various disadvantage and inconveniences from taking place owing to too much easy deformation of the conductive, multilayer-structured resin particles, such as instability of connection caused by inability for the conductive, multilayer-structured resin particles to get into contact with a connecting site while pushing away or displacing adhesive resins existing around them and their failure to maintain line insulating resistance through short circuits formed among the conductive particles, and also for suppression of crack development on the ITO electrode, as well as so as to protect long-term reliability of connection from being lacking due to difficulties in holding adequate surf ace contact with the connecting site with a minimal strength.

The expression "10% compressive strength" as defined in the present invention signifies a physical strength measured when a particle size of the conductive, multilayer-structured resin particles shows a 10% displacement with use of a microcompression testing machine (supplied by Shimadzu Selsakusho of Japan:MCTM-500) as usually employed.

The restoring rate of the conductive, multilayer-structured resin particles desirably is in the range of about 5 to 90%, preferably about 10 to 60%. The above-described range is preferred, in light of the fact that contact pressure required for connection must be maintained at a high level, while there should be avoided the situation where the compressive strength increases enough to need an excessively great strength for connection of the anisotropic conductive adhesive.

The term "restoring rate" as specified in the present invention is as measured with use of the above-described microcompression testing machine, and expresses in % a rate of a displacement measured under applied load of 1 g which is recoverable on removal of said load. When explained in detail, when load is applied onto the conductive, multilayer- structured resin particles with use of the microcompression testing machine, a relationship between load and compression displacement, as delineated in FIG. 3, shows that as a compression displacement increases with rising load, the displacement is recovered upon removal of the load at the point A in the figure where the load reaches 1 g weight; a ratio of the restored quantity b to the compression displacement a as measured at this point of time, or (b/a)×100, is defined as the restoring rate (%).

The anisotropic conductive adhesives of the present invention consist of an adhesive resin constituting an adhesive, the conductive, multilayer-structured resin particles as described previously, and a variety of additives, in which the used amount of the conductive, multilayer-structured resin particles is normally in the range of 0.1 to 20 parts by wt., preferably about 0.5 to 15 parts by wt., more preferably about 1 to 10 parts by wt., against 100 parts of the adhesive resin component.

The used amount in the above range is preferable so as to prevent connection resistance from rising and to improve reliability of connection, and also for the purpose of avoiding the situation where increased pressure becomes needed for connection due to increases in melt viscosity, as well as in order to secure adequately anisotropy of connection.

As the adhesive resin component for the anisotropic conductive adhesives being utilized in the present invention, there can be used any of such resin components, only if they are put into normal use. Namely, either of thermoplastic and thermosetting resins may be usable, only if they develop adhesion capacity through heating.

Specifically, there may be mentioned those being prepared as a resin component as obtained by combination of one or not less than two resins selected from ethylene-vinyl acetate copolymers, carboxyl-modified ethylene-vinyl acetate copolymers, ethylene-isobutyl acrylate copolymers polyamides, polyamides, polyesters, polyvinyl ethers, polyvinyl butyrals, polyurethanes, SBS blocked copolymers, carboxyl-modified SBS copolymers, SIS copolymers, SEBS copolymers, maleic acid-modified SEBS copolymers, polybutadiene rubbers, chloroprene rubbers, carboxyl-modified chloroprene rubbers, styrene-butadiene rubbers, isobutylene-isoprene copolymers. acrylonitrile-butadiene rubbers (hereinafter referred to as "NBR"), carboxyl-modified NBR, amine-modified NBR, epoxy resins, epoxy ester resins, acrylic resins, phenol resins and silicone resins.

Preferred among them are thermoplastic resins, with styrene-butadiene rubbers and SEBS excelling in reworking property. As a thermosetting resin, epoxy resins are preferable. The most preferable among these are epoxy resins in light of their advantages of increased adhesion strength, excellent heat resistance and electrical insulation, decreased melt viscosity and connection realizable with lowered pressure.

The anisotropic conductive adhesives which are used in the present invention are preferably admixed with particles having rubber elasticity as a stress relaxing agent.

The particles having rubber elasticity as a stress relaxing agent suppress warping caused by a difference in coefficient of linear expansion between a cured adhesive resin and an adhesion substrate, eventually contributing to enhancement of reliability of the anisotropic conductive adhesives.

Rubber elasticity is the property owned by any materials which normally possess a minor modulus of elasticity but a greater elongation at break and can deform markedly under applied load but restore to the initial size upon removal the load, or have restoring force.

As the particles having rubber elasticity, there can be used, for example, silicone rubbers, acrylic rubbers, urethane rubbers, butadiene-containing rubbers and the like.

Also, the multilayer structured particles containing a layer composed of rubber-flexible polymers are preferable in terms of the overall aspects inclusive of the ease of handling, retained reproducibility and stability of manufacturing attributed to excellent diserpsability as a primary particle, decreased cost, and desired stress relaxing effect.

The multilayer structured particles having rubber elasticity according to the present invention are multilayer structured particles having at least one layer composed of rubbery flexible polymers, and, for example, preferable are the multilayer-structured particles characterized by less than 5% of a toluene soluble content and 50 to 500% of toluene swelling ratio.

The multilayer-structured particles having rubber elasticity in the present invention can be obtained, for example, by a continuous multistage emulsion polymerization process which permits a polymer in the subsequent stage to undergo sequential seeded polymerization in the presence of a polymer in the preceding stage.

Specifically, a seed latex is prepared by emulsion polymerization, and then, the first layer is synthesized by seeded polymerization, followed by repetition of seeded polymerization to form the second and later-stage layers, thus permitting the multilayer-structured particles to be produced.

Below described in detail is the production of the multilayer-structured particles having rubber elasticity, but the multilayer-structured particles having the below-described structure and rubber elasticity represent one embodiment of the present invention, and needless to say, the present invention is not limited to them:

In the first place, described is the production of two-layer structured particles which consist of the first layer composed of a rubbery flexible polymer and the second layer composed of a glassy rigid polymer at room temperature of 25° C. polymerization of seed particles is carried out by charging at once monomers coping with the required characteristic properties, followed by emulsion polymerization. As the monomers, methyl methacrylate and ethyl acrylate are preferable.

In the first-layer polymerization, monomers capable of forming a rubbery flexible polymer are subjected to emulsion polymerization in the presence of a seed latex.

In order to demonstrate the characteristic properties as a particle having rubber elasticity, a polymer constituting the first layer preferably shows a glass transition temperature of less than 25° C., especially less than −10° C.

The term "glass transition temperature" refer to a temperature at which tan δ in the measurement of dynamic viscoelasticity reaches the peak.

As a principal component of the monomers capable of forming a rubbery flexible polymer which are used in the emulsion polymerization for the first layer, conjugated dienes or alkyl acrylates having an alkyl group with 2 to 8 of a number of carbon atoms, or mixtures thereof are preferred.

The conjugate dienes include, for example, butadiene, isoprene and chloroprene, with butadiene being particularly preferable.

The above-described alkyl acrylates having an alkyl group with 2 to 8 of a number of carbon atoms include, for example, ethyl acrylate, propyl acrylate, butyl acrylate, cyclohexyl acrylate and 2-ethylhexyl acrylate, with butyl acrylate being particularly preferred.

In the polymerization for the first layer, the conjugated dienes or alkyl acrylates or mixtures thereof as described above can also be copolymerized with monomers being copolymerizable with them, for example, aromatic vinyls or aromatic vinylidenes, such as styrene, vinyltoluene and α-methylstyrene; vinyl cyanides or vinylidene cyanides, such as acrylonitrile and methacrylonitrile; alkyl methacrylates, such as methyl methacrylate and butyl methacrylate; and aromatic (meth)acrylates, such as benzyl acrylate, phenoxyethyl acrylate and benzyl methacrylate.

Also, monomers having a functional group, such as epoxy, carboxyl, hydroxyl or amino group can be subjected to copolymerization. For example, as the monomers having an epoxy group, there may be mentioned glycidyl methacrylate, while the monomers having a carboxyl group include, for example, methacrylic acid, acrylic acid, maleic acid or itaconic acid, and the monomers having a hydroxyl group include, for example, 2-hydroxyethyl methacrylate or 2-hydroxyethyl acrylate.

In the present invention, it is particularly preferred to use crosslinking monomers and graft-polymerizable monomers as a copolymerizable monomer, regardless of use of conjugated dienes in the polymerization for the first layer, and this enables improved dispersion in organic solvents, solutions of polymers and in liquid resins to be realized.

The crosslinking monomers normally possess a plural number of the same polymerizable groups, such as vinyl group, which signify the monomer involved in the reaction, and the graft-polymerizable monomers normally have a plural number of polymerizable groups, with different reactivities, such as a combination of acryl group with aryloyl group, which mean the monomers involved in the reaction.

As the above-described crosslinking monomers, for example, there can be mentioned aromatic vinyl compounds, such as divinylbenzene, and alkane polyol polyacrylates or alkane polyol polymethacrylates, such as ethylene glycol diacrylate, ethylene glycol dimethacrylate, butylene glycol diacrylate, hexanediol diacrylate, hexanediol dimethacrylate, oligoethylene glycol diacrylate, oligoethylene glycol dimethacrylate, trimethylol propane diacrylate, trimethylol propane dimethacrylate, trimethylol propane triacrylate and trimethylol propane trimethacrylate, with butylene glycol diacrylate and hexanediol diacrylate being preferably used.

Such crosslinking monomers can be in proportions in the range of about 0.2 to 10.0 wt. %, preferably about 0.2 to 4.0 wt. %, against the total amount of monomers used in the polymerization for the first layer.

As the graft-polymerizable monomers, for example, there can be mentioned allyl esters of unsaturated carboxylic acids, such as allyl acrylate, allyl methacrylate, diallyl maleate, diallyl fumarate and diallyl itaconate, with allyl methacrylate being preferably used.

Such graft-polymerizable monomers can be in proportions in the range of about 0.2 to 10.0 wt. %, preferably about 0.2 to 4.0 wt. %, against the total amount of monomers used In the polymerization for the first layer.

After preparation of a rubbery flexible polymer latex for the first layer as described above, then, the polymerization for the second layer is carried out in the presence of such rubbery flexible polymer latex while using monomers capable of forming a glassy rigid polymer. Whereby a glassy rigid polymer having a glass transition temperature of not less than 40° C., preferably not less than 60° C., is formed on the outermost layer.

As the monomer capable of forming a glassy rigid polymer, for example, there can preferably be used methyl methacrylate or styrene or monomers copolymerizable with them.

As the monomers copolymerizable with methyl methacrylate or styrene, there can be mentioned vinyl polymerizable monomers, for example, alkyl acrylates, such as ethyl acrylate or butyl acrylate; alkyl methacrylates, such as ethyl methacrylate or butyl methacrylate; aromatic vinyls or aromatic vinylidenes, such as vinyltoluene or α-methylstyrene; vinyl cyanides or vinylidene cyanides, such as acrylonitrile or methacrylonitrile, with ethyl acrylate or acrylonitrile being preferably used.

Also, monomers having a functional group, such as epoxy, carboxyl, hydroxyl or amino group can be subjected to copolymerization. For example, as the monomers having an epoxy group, there may be mentioned glycidyl methacrylate, while the monomers having a carboxyl group include, for example, methacrylic acid, acrylic acid, maleic acid or itaconic acid, and the monomers having a hydroxyl group include, for example, 2-hydroxyethyl methacrylate or 2-hydroxyethyl acrylate.

In the polymerization for the second layer, as well, a small amount of crosslinking monomers as a copolymerizable monomer can be used to thereby give multilayer-structured having an enhanced degree of dispersability. In cases where crosslinking monomers are used, the above-described crosslinking monomers are preferably used in proportions in the range of less than about 5.0 wt. %, particularly about 0.1 to 2.0 wt. %, against the total amount of monomers used in the polymerization for the second layer.

In the multilayer-structured particles of the present invention, the first layer composed of a rubbery flexible polymer preferably occupies 40 wt. % to 90 wt. % of the whole multilayer-structured particles.

In the production of the multilayer-structured particles according to the present invention, examples of the polymerization initiator employable in the emulsion polymerization of the above-described monomers include persulfate based polymerization initiators, such as sodium persulfate or potassium persulfate; azo-compound based polymerization initiators, such as azobisisobutyronitrile, 2,2'-azobis(2-amidinopropane) dihydrochloride, 2,2'-azobis-2-(2-imidazolin-2-yl)propane or dimethyl methylpropaneisobutyrate; and organic peroxide-based polymerization initiators, such as cumeme hydroperoxide and diisopropylbenzene hydroperoxide.

As the surfactant usable in the said polymerization, there can be mentioned anionic surfactants, such as sodium dodecylbenzene sulfonate or sodium dioctylsulfosuccinate; and nonionic surfactants, such as polyoxyethylene nonylphenyl ether or polyoxyethylene monostearate.

Described in the following is the production of three-layer structured particles consisting of the first layer composed of a glassy rigid polymer, the second layer composed of a rubbery flexible polymer and the third layer composed of a glassy rigid polymer:

With reference to the compositions of such glassy rigid polymer and rubbery flexible polymer, there can be used glassy rigid polymers and rubbery flexible polymers having the same compositions as the individual polymers described in the above.

The polymerization for the first layer is carried out in the presence of the above-mentioned seed latex with use of monomers capable of forming a glassy rigid polymer, whereby it is preferable to form a glassy rigid polymer of a glass transition temperature of not less than 40° C., preferably not less than 60° C., as the first layer.

The subsequent polymerization for the second layer allows monomers capable of forming a rubbery flexible polymer to undergo emulsion polymerization in the presence of a latex of the glassy rigid polymer produced for the first layer. The polymer constituting the second layer shows a glass transition temperature of less than about 25° C. preferably less than about –10° C.

The last polymerization for the third layer is conducted in the above-mentioned latex for the second layer by use of monomers capable of forming a glassy rigid polymer, whereby it is preferred to form a glassy rigid polymer of a glass transition temperature of not less than about 40° C., preferably not less than about 60° C., on the outermost layer.

The three-layer structured particles as produced by the above procedure are preferably occupied by the second layer composed of a rubbery flexible polymer at a ratio in the range of about 30 wt. % to 80 wt. % against the total three-layer structured particles, with a weight ratio of the first layer: the second layer: the third layer in the range of 10 to 50:30 to 80:10 to 60 being preferred.

The multilayer-structured particles having rubber elasticity according to the present invention may consist of not less than four layers.

However, at least one or more layers composed of a rubbery flexible polymer must be present in such particles, while the outermost layer is preferably composed of a glassy rigid polymer.

The weight ratio of the layer or layers composed of a rubbery flexible polymer in the total multilayer-structured particles preferably is in the range of about 30 wt. % to 80 wt. %.

The particle size of the multilayer-structured particles as produced by the above-described procedure is not particularly limited, but is normally in the region of about 100 to 1000 nm, preferably about 120 to 750 nm.

The multilayer-structured particles having rubber elasticity according to the present invention preferably show a content of toluene solubles of less than 5% and a degree of toluene swelling of 50 to 500%.

The term "a content of toluene solubles" a used herein refers to a weight ratio of a component eluted in toluene when a specifically determined volume of the multilayer-structured particles is immersed in a 20-fold volume of toluene to the employed multilayer-structured particles, while the term "a degree of toluene swelling" represents an increased volume brought about by swelling when a specifically determined volume of the multilayer-structured particles is immersed in a 10-fold volume of toluene for a predetermined length of time.

After conclusion of the emulsion polymerization, the multilayer-structured particles having rubber elasticity may be admixed with a lubricant and/or an emulsion or suspension of inorganic particles.

The proportion in which the multilayer-structured particles of the present invention is mixed with a lubricant and/or inorganic particles preferably is in the range of about 0.3 to 10 parts by wt. of the lubricant and/or inorganic particles against 100 parts by wt. of the multilayer-structured particles.

As the lubricant, for example, there can be used hydrocarbon waxes, such as liquid paraffin, paraffin wax, microwax or polyethylene wax; fatty acid/higher alcohol based waxes, such as stearic acid, 12-hydroxystearic acid or stearyl alcohol; amide based waxes, such as stearic acid amide, oleic acid amide, erucic acid amide, methylene bis-stearic acid amide, ethylene bis-stearic acid amide or ethylene bis-oleic acid amide; ester based waxes, such as butyl stearate, monoglyceride of stearic acid, pentaerythritol tetrastearate, hardened castor oil or stearyl stearate; and metal soaps, such as calcium stearate, zinc stearate, magnesium stearate or lead stearate.

As the inorganic particles, for example, there can be utilized such aluminum compounds as alumina, such calcium compounds as calcium carbonate, such titanium compounds as titanium oxide, and such silcon compounds as colloidal silica.

The multilayer-structured particles of the present invention, as produced by the above-described procedures, can be frozen and thawed to separate out the particles, followed by dehydration through centrifugation and drying to thereby take out them in the form of granules, flakes or powders.

Spray-drying by use of a spray dryer and salting-out are also available as a means of taking out the multilayer-structured particles, but when the multilayer-structured particles are to be used in the fields of electric/electronic materials and the like where contamination with impurities is strictly prohibited, the method by way of freezing/thawing is preferable.

Besides, the anisotropic conductive adhesives according to the present invention may be suitably incorporated with tackifiers, reactive auxiliary agents, metal oxides, photoinitiators, sensitizers, curing agents, vulcanizing agents, antioxidants, heat-resistant additives, heat conduction improving agents, softeners, coloring agents, various coupling agents or metal inactivating agents, etc.

Example of the tackifier included in resin, rosin derivatives, terpene resins, terpene phenol resins, petroleum resins, cumarone-indene resins, styrene-based resins, isoprene-based resins, alkylphenol resins and xylene resins.

The reactive auxiliary agents or crosslinking agents include, for example, polyols, isocyanates, melamine resins, urea resins, utropins, amlnes, acid anhydrides and peroxides.

The anisotropic conductive adhesives of the present invention are produced by formulating the multilayer-structured resin particles of the present invention with resin components for adhesives. curing agents and, if desired, a variety of additives, with use of the production equipment and machinery being extensively employed in the art, followed by mixing in organic solvent in the case of thermoplastic resins being used as an adhesive resin component or melt-mixing, in the case of thermoplastic resin being utilized as a resin component for adhesive, at a temperature of not less than the softening point of such resin component for adhesive, specifically ranging from about 50 to 130° C., preferably from about 60 to 110° C.

EXAMPLES

The abbreviations as used in examples and comparative example are as follows:

| Monomer: | |
|---|---|
| n-Butyl acrylate | BA |
| Methyl methacrylate | MMA |
| Ethyl acrylate | EA |
| Styrene | SM |
| Crosslinking monomer: | |
| 1,4-Butyleneglycol diacrylate | BDA |
| Divinylbenzene | DVB |
| Graft-polymerizable monomer: | |
| Allyl methacrylate | ALMA |
| Dispersing agent: | |
| Polyvinyl alcohol with a saponification degree of 88% | PVA |
| Tricalcium phosphate | TCP |
| Miscellaneous: | |
| Sodium dioctyl sulfosuccinate | SSS |
| Deionized water | DIW |
| Sodium hydrogencarbonate | SHC |
| Sodium persulfate | SPS |
| Lauroyl peroxide | LPO |
| 2,2'-Azobisibobutyronitrile | AIBN |
| Charge-controlling agent (quaternary ammonium salt produced by Orient Chemical Ind.) | P-53 |
| Modified acrylic resin (carboxyl-group modified acrylic resin produced by Mitsubishi Rayon Co.) | BR-77 |

In calculating Tg of each layer by the equation (1), the following values are used as Tg of homopolymer of each constituent:

| | |
|---|---|
| BA | −40° C. |
| MMA | 130° C. |
| EA | −24° C. |
| SM | 105° C. |
| BGA | 100° C. |
| DVB | 100° C. |
| ALMA | 100° C. |

Method for Measuring a Weight Average Particle Size

The multilayer-structured resin particles produced by the suspension polymerization or dispersion polymerization were subjected to measurement by the electric resistance method with use of Coulter Multisizer II (supplied by Beckmann-Coulter Co.). Also, the multilayer-structured resin particles synthesized by the emulsion polymerization were subjected to measurement by the dynamic light scattering method with use of a dynamic light scattering measuring device (Model LPA-3000/LPA-3100) manufactured by Ohtuska Denshi Co.

Measurement of 10% Compressive Strength and Restoring Rate

With use of a microcompression testing machine MCTM-500 (manufactured by Shimadzu Seisakusho Co.), 10% compressive strength was measured under the conditions of the testing mode; 1 (compression test), testing load; 50 g weight, displacement full-scale: 50 $\mu$m, compression probe; flat surface 50 $\mu$m$\phi$, and loading speed, 1.975 g weight/sec.

The restoring rate was measured under the conditions of the testing mode; 1 (loading/unloading test), reversing load; 1.00 g weight, loading speed; 0.455 g weight/sec, displacement full-scale; 50 $\mu$m, compression probe; flat surface 50 $\mu$m$\phi$, and load for initial point; 0.1 g weight.

Example 1
Production of Conductive, Multilayer-Structured Resin Particles A

Charged into a 7-liters capacity polymerization vessel were 2870 g of DIW and 430 g of a 5% aqueous solution of PVA, and a monomer mixture solution consisting of 595 g of MMA, 341 g of BA, 19.5 g of BGA and 19.5 g of ALMA which had 14.6 g of LPO as a polymerization initiator dissolved the resin in advance was added at once, while stirring at a speed of 11000 rpm with TK Homomixer (manufactured by Tokushu Kika kogyo Co.), followed by dispersion treatment for another one hour to give liquid particulates of the monomer.

The vessel was fitted with a stirrer and a reflux condenser, and warming was effected to 55° C. under stirring in a nitrogen stream. After the reaction was allowed to proceed as such for 2 hours, the reaction mixture was warmed to 60° C. and admixed continuously over the period of 10 min. with an emulsion of the below-described monomers capable of forming the second layer:

| | |
|---|---|
| MMA | 451.5 g |
| EA | 52.5 g |
| BGA | 10.5 g |
| AIBN | 10.5 g |
| 1% aqueous solution of SSS | 210.0 g |
| 1% aqueous solution of SHC | 52.5 g |
| DIW | 105.0 g |

At the point of time when the exothermic peak was observed after initiation of polymerization, warming was effected up to 80° C. to carry out a maturated reaction for 2 hours.

The resultant suspension was freed of PVA with a 25% aqueous sodium hydroxide solution and a 35% aqueous hydrogen peroxide solution, then cooled to room temperature, dehydrated and washed with a centrifuge, and scattered uniformly with a solution of 1.5 g of γ-aminopropyltrimethoxysilane in 13.5 g of methanol, followed by adequate mixing.

Furthermore, air-drying was done at 60° C. overnight and sifting through a 200-mesh screen was effecting to thereby give 1350 g of multilayer-structured resin particles. Then, air classification was carried out with a classifier of Turbplex 50ATP (manufactured by Hosokawa Micron KK), and electroless nickel plating and electroless gold plating were provided in thickness of 0.1 $\mu$m and 0.02 $\mu$m, respectively to produce Metal-Covered, Multilayer-Structured Resin Particles A.

The Metal-Covered, Multilayer-Structured Resin Particles A were found to show a weight average particle size of 4.9 $\mu$m and a particle size distribution dw/dn of 1.14. The Tg value of Metal-Covered, Multilayer-Structured Resin Particles A as determined by the equation (1) was 47° C. for the first layer and 105° C. for the second layer, respectively.

Example 2
Production of Conductive, Multilayer-Structured Resin Particles B

By following the same procedure as described in Example 1 except preparation by dispersion polymerization, there were obtained Metal-Covered Multilayer-Structured Resin Particles B.

The Metal-Covered, Multilayer-Structured Resin Particles B were found to show a weight average particle size of 4.8 $\mu$m and a particle size distribution dw/dn of 1.07. The Tg value of Metal-Covered, Multilayer-Structured Resin Particles B as determined by the equation (1) was 47° C. for the first layer and 105° C. for the second layer, respectively.

Example 3
Production of Conductive, Multilayer-Structured Resin Particles C

By following the same procedure as described in Example 1 except the facts that the particles were of three-layer structured resin particles showing the composition as given in Table 1 and that the below-described three procedural steps were adopted, there were obtained Metal-Covered Multilayer-Structured Resin Particles C: (1) As a dispersion stabilizer, TCP was used at a rate of 15 parts by wt. against 100 parts by wt. of monomers to replace PVA, (2) For the purpose of making a particle size distribution sharper, BR-77 and micropulverized P-53, during polymerization for the first layer, were added to the monomer mixture solution in proportions of 1 part by wt. and 0.5 part by wt. against 100 parts by wt. of monomers, respectively, and (3) 35% hydrochloric acid in 2-fold the volume of TCP was added to dissolve TCP and to effect dehydration and washing.

The Metal-Covered, Multilayer-Structured Resin Particles C were found to show a weight average particle size of 5.1 $\mu$m and a particle size distribution dw/dn of 1.10. The Tg value of Metal-Covered. Multilayer-Structured Resin Particles C as determined by the equation (1) was 105° C. for the first layer, 36° C. for the second layer and 106° C. for the third layer, respectively.

Example 4
Production of Multilayer-structured Particles Having Rubber Elasticity Charged into a 3-liters capacity polymerization vessel were 121 g of DIW, 3.1 g of a 1% aqueous NP solution and 20.5 g of a 1% aqueous SHC solution, and the mixture solution was warmed to 70° C. with stirring under a nitrogen stream. After 10.2 g of EA was added and dispersed over 10 min., 5.1 g of a 2% aqueous SPS solution was added and the reaction was allowed to proceed for 1 hour under stirring. Finally, the reaction mixture was diluted with 61 g of DIW to make a seed latex.

Then, 85 g of a 2% aqueous SPS solution was added, and after 1264.8 g of an emulsion of the below-described monomers was continuously fed over the period of 240 min., the reaction mixture was warmed to 90° C. followed by a maturation reaction for 1 hour to yield a latex containing the particles forming the first layer:

[Emulsion of Monomers Forming the First Layer]

| BA | 789.4 g |
| BGA | 16.8 g |
| ALMA | 33.6 g |
| 1% aqueous NP solution | 340.0 g |
| 1% aqueous SHC solution | 42.5 g |
| DIW | 42.5 g |

Subsequently, the reaction mixture was cooled to 70° C. to thereby conduct polymerization for the second layer.

15 g of a 2% aqueous SPS solution was added, and after 270 g of the below-described emulsion of monomers was continuously fed over 180 min, the reaction mixture was warmed to 90° C. to carry out a maturation reaction for 1 hour:

[Emulsion of Monomers Forming the Second Layer]

| MMA | 133.5 g |
| EA | 15.0 g |
| BGA | 1.5 g |
| 1% aqueous NP solution | 60.0 g |
| 1% aqueous SHC solution | 15.0 g |
| DIW | 45.0 g |

After conclusion of maturation, the mixture was cooled to 30° C. and filtered through a 300-mesh wire netting made of stainless steel to give a latex containing multilayer-structured particles with rubber elasticity.

The latex was frozen at −30° C., then thawed, dehydrated by a centrifuge and washed, followed by air-drying at 60° C. for one day to give 950 g of multilayer- structured particles having rubber elasticity.

Example 5
Production of Anisotropic Conductive Adhesive A

Adequately mixed were 30 parts by wt. of an epoxy resin (Epotohto YD-128; produced by Tohto Kasei Co.), 40 parts by wt. of a phenoxy resin (Phenotohto YP-50; produced by Tohto Kasei Co.), a curing agent (Novacure HX 3921 HP; produced by Asahi Chem. Ind., Co.), 1 part by wt. of a silane coupling agent (KBE-503; produced by Shin-Etsu Chem. Co.) and 18 parts by wt. of methyl ethyl ketone, and 5 parts by wt. of the Conductive, Multilayer-Structured Resin Particles A as obtained in Example 1 was uniformly dispersed into the mixture to give Anisotropic Conductive Adhesive A.

The Anisotropic Conductive Adhesive A was applied onto a surface-processed 50 $\mu$m thick PET film to a finished thickness of 15 $\mu$m, and dried, followed by cutting to breadth of 2 mm to give anisotropic conductive adhesive films.

Connection with the Anisotropic Conductive Adhesive

After the anisotropic conductive adhesive film was adhered to a glass substrate having a 1.1 mm thick ITO solid electrode (surface resistively of 30 ($\Omega$/□), the PET film was removed, followed by provisional pressure adhesion to TCP having a copper pattern breadth of 25 $\mu$m and a pattern pitch of 75 $\mu$m formed on 75 $\mu$m thick polyimide and heat pressured adhesion at aheating temperature of 160° C. for aheating time of 15 seconds and under pressure of 30 kg/cm$^2$ to effect the connection.

Evaluation of the Anisotroplc Conductive Adhesive

The conduction resistance between neighboring two copper terminal adjacent at TCP was measured (initial resistance), whereby it is to be noted that the conduction resistance in excess of 10$\Omega$ is not practically desired. By way of reliability of connection, the conduction resistance was measured after 1000 cycles of the thermal shook test 85° C.×30 min to 40° C.×30 min. and after high-temperature/high-humidity test in which a test specimen was left at 80° C. and 90% RH for 1000 hours, respectively, with the results being tabulated in Table 2.

Example 6
Production of Anisotropic Conductive Adhesive B

By following the same procedure as described in Example 5 except use of the conductive multilayer-structured resin particles as produced in Example 2, there was obtained Anisotropic Conductive Adhesive B, which was evaluated in the same manner as described in Example 5.

Example 7
Production of Anisotropic Conductive Adhesive C

By following the same procedure as described in Example 5 except use of the conductive multilayer-structured resin particles as produced in Example 3 and addition to an adhesive resin component of the multilayer-structured particles having rubber elasticity as Indicated in example 4 at a ratio of 5 parts by wt. against 100 parts by wt. of a resin component, there was obtained Anisotropic Conductive Adhesive C.

With such anisotropic conductive adhesive, evaluation was effected in the same manner as described in Example 5.

Comparative Example 1
Production of Conductive, Multilayer-Structured Resin Particles D By following the same procedure as described in Example 1 except MMA being contained as a graft-polymerizable monomer in the first layer in place of ALMA, there were obtained Conductive, Multilayer-Structured Resin Particles D.

The Conductive, Multilayer-Structured Resin Particles D were found to show a weight average particle size of 4.9 m and a particle size distribution dw/dn of 1.14. The Tg value of the Conductive, Multilayer-Structured Resin Particles D as determined by the equation (1) was 48° C. for the first layer and 105° C. for the second layer, respectively.

Comparative Example 2
Production of Conductive, Multilayer-Structured Resin Particles E By following the same procedure as described in Example 1 except the first and second layers were reversed, there were obtained Conductive, Multilayer-Structured Resin Particles E.

The Conductive, Multilayer-Structured Resin Particles E were found to show a weight average particle size of 4.9 $\mu$m and a particle size distribution dw/dn of 1.14. The Tg value of the Conductive, Multilayer-Structured Resin Particles E as determined by the equation (1) was 105° C. for the first layer and 47° C. for the second layer, respectively.

Comparative Examples 3 and 4
Production of Anisotropic Conductive Adhesives D and E By following the same procedure as described in Example 3 except use of Conductive, Multilayer-Structured Resin Particles D and E as produced in Comparative Examples 1 and 2, there were obtained Anisotropic Conductive Adhesives D and E.

With these anisotropic conductive adhesives, evaluation was effected in the same manner as described In Example 5.

TABLE 3

|  | Example 1 | Example 2 | Example 3 | Comparative Example 1 | Comparative Example 2 |
|---|---|---|---|---|---|
| 1st layer: | | | | | |
| BA | 35 | 35 | | 35 | 10 |
| MMA | 61 | 61 | | 63 | 86 |
| SM | | | 99 | | |
| DVB | | | 0.5 | | |
| BGA | 2 | 2 | | 2 | 2 |
| ALMA | 2 | 2 | 0.5 | | 2 |
| 2nd layer: | | | | | |
| BA | | | 41 | | |
| MMA | | | 55 | | |
| GGA | | | 2 | | |
| ALMA | | | 2 | | |
| 3rd layer: | | | | | |
| MMA | 86 | 86 | 88 | 86 | 61 |
| EA | 10 | 10 | 10 | 10 | |
| BA | | | | | 35 |
| BGA | 2 | 2 | 2 | 2 | 2 |
| ALMA | 2 | 2 | — | 2 | 2 |
| 1st layer/(2nd layer)/Outermost layer: | 65/35 | 65/35 | 30/45/25 | 65/35 | 65/35 |
| 1st layer (2nd layer) | 47 | 47 | 105 36 | 48 | 105 |
| Outermost layer | 105 | 105 | 106 | 105 | 47 |
| Particle size dw (um) | 4.9 | 4.8 | 5.1 | 4.9 | 4.9 |
| Particle size distribution dw/dn | 1.14 | 1.07 | 1.10 | 1.14 | 1.14 |
| 10% compressive strength (kgf/cm2) | 2.8 | 2.5 | 2.1 | 2.2 | 1.8 |
| Restoring rate (%) | 58 | 51 | 64 | 36 | 16 |
| 1st layer/(2nd layer)/outermost layer | F/R | F/R | R/F/R | F/R | R/F |

Note: The letters "F" and "R" stand for "flexible" and "rigid", respectively.

TABLE 4

|  | Example 5 | Example 6 | Example 7 | Comparative Example 3 | Comparative Example 4 |
|---|---|---|---|---|---|
| resin particles(1) | A | B | C | D | E |
| Conduction resistance: | | | | | |
| Initial resistance ($\Omega$) | 2.1 | 1.8 | 1.6 | 2.4 | 2.6 |
| After thermal shock test ($\Omega$)(2) | 3.9 | 3.2 | 2.3 | 67 | 138 |
| After high temp. high humidity test ($\Omega$)(3) | 3.2 | 5.1 | 2.1 | 52 | 51 |

Notes:
(1)Metal-covered, Multilayer-structured resin particles
(2)1000 cycles of −40° C. × 30 min to 85° C. × 30 min.
(3)1000 hours at 80° C. and 90% RH The conductive, multilayer-structured resin particles according to the present invention possesses the contradictory properties of flexibility and rigidity, and can deform under small compressive strength applied, while it excels in restoring rate.

The anisotropic conductive adhesives according to the present invention, which contain the above-described conductive, multilayer-structured resin particles, do not require great magnitude of strength to achieve connection and as a result, can suppress development of cracking of the ITO electrode. Also, the adhesives provide wider surface area of connection and can produce the advantageous effect of improving reliability of electric connection.

In addition, the anisotropic conductive adhesives according to the present invention can get into contact with the connecting sites at increased pressure, because the conductive, multilayer-structured resin particles contained therein exhibit excellent restoring rate, thus attaining the desirable effect of facilitating the connection resistance to be maintained at a constant level over a prolonged period of time.

Furthermore, the anisotropic conductive adhesives according to the present invention, which contain particles having rubber elasticity, especially multilayer-structured particles, can suppress warping caused by the difference in coefficient of linear expansion between the cured adhesive resin and the adhesion substrate, and as a result, can enhance reliability as a conductive adhesive.

What is claimed is:

1. A conductive, multilayer-structured resin particle comprising at least one inner polymer layer and an outermost polymer layer, in which the at least one inner polymer layer is more flexible than the outermost polymer layer, and the surface of the outermost polymer layer is covered with a metal.

2. A conductive, multilayer-structured resin particle comprising at least one inner polymer layer, and an outermost polymer layer, in which the at least one inner polymer layer is more flexible than the outermost polymer layer and is chemically bound to at least one adjacent polymer layer, and the surface of the outermost polymer layer is covered with a metal.

3. The conductive, multilayer-structured resin particle as claimed in claim 2, wherein the difference in glass transition temperature between the most flexible polymer layer and the most rigid polymer layer is not less than 20° C.

4. The conductive, multilayer-structured resin particle as claimed in claim 2, wherein at least one of the chemically bound, two adjacent polymer layers contains a graft-polymerized monomer.

5. The conductive, multilayer-structured resin particle as claimed in claim 2, wherein said conductive, multilayer-structured resin particle possesses a three-layer polymer structure consisting of a rigid, central core polymer layer, an intermediate polymer layer which is more flexible than the central core polymer layer and the outermost polymer layer which is more rigid than the intermediate polymer layer, with any adjacent two of these three polymer layers being chemically bound to each other.

6. The conductive, multilayer-structured resin particle as claimed in clam 2, wherein said conductive, multilayer-structured resin particle under stress of 10% deformation ratio exhibits a compressive strength of not more than 10 kgf/mm$^2$.

7. The conductive, multilayer-structured resin particle as claimed in claim 2, wherein said conductive, multilayer-structured resin particle furthermore shows a restoring rate of 5 to 90%.

8. An anisotropic conductive adhesive which comprises an adhesive resin component and a conductive, multilayer-structured resin particle as claimed in claim 2.

9. The anisotropic conductive adhesive as claimed in claim 8, wherein said adhesive resin component contains particles showing rubber elasticity.

10. The anisotropic conductive adhesive as claimed in claim 9, wherein said particles showing rubber elasticity are a multilayer-structured particle consisting of not less than two polymer layers.

11. A stress relaxing agent, wherein said stress relaxing agent comprises a particle showing rubber elasticity as claimed in claim 10.

* * * * *

UNITED STATES PATENT AND TRADEMARK OFFICE
CERTIFICATE OF CORRECTION

PATENT NO.    : 6,352,775 B1  
DATED         : March 5, 2002  
INVENTOR(S)   : Ichiro Sasaki et al.

It is certified that error appears in the above-identified patent and that said Letters Patent is hereby corrected as shown below:

<u>Title page,</u>  
Item [73], change the Assignee "Takeda Chemical Industries Ltd., Osaka (JP)" to -- Mitsui Takeda Chemicals Inc., Tokyo (JP) --.

Signed and Sealed this

Twentieth Day of August, 2002

Attest:

Attesting Officer

JAMES E. ROGAN  
*Director of the United States Patent and Trademark Office*